United States Patent
Obata

(10) Patent No.: US 10,921,906 B2
(45) Date of Patent: Feb. 16, 2021

(54) PEN-SHAPED POSITION INDICATOR

(71) Applicant: Wacom Co., Ltd., Saitama (JP)

(72) Inventor: Masayuki Obata, Tokyo (JP)

(73) Assignee: Wacom Co., Ltd., Saitama (JP)

( * ) Notice: Subject to any disclaimer, the term of this patent is extended or adjusted under 35 U.S.C. 154(b) by 201 days.

(21) Appl. No.: 15/013,853

(22) Filed: Feb. 2, 2016

(65) Prior Publication Data

US 2016/0188019 A1  Jun. 30, 2016

Related U.S. Application Data

(63) Continuation of application No. 13/863,220, filed on Apr. 15, 2013, now Pat. No. 9,483,127.

(30) Foreign Application Priority Data

Jun. 6, 2012 (JP) .............................. JP2012-128834

(51) Int. Cl.
*G06F 3/0354* (2013.01)
*G06F 3/046* (2006.01)
(Continued)

(52) U.S. Cl.
CPC .......... *G06F 3/03545* (2013.01); *G06F 3/046* (2013.01); *H01G 4/015* (2013.01);
(Continued)

(58) Field of Classification Search
CPC .... G06F 3/03545; G06F 3/0414; G06F 3/044; G06F 3/046; G06F 2203/0381;
(Continued)

(56) References Cited

U.S. PATENT DOCUMENTS 2,139,453 A    12/1938 Linder
4,719,539 A    1/1988 Lavene
(Continued)

FOREIGN PATENT DOCUMENTS

CH    355524 A    7/1931
JP    45-33821    10/1970
(Continued)

OTHER PUBLICATIONS

Notification of Reasons for Refusal and Partial Translation, dated Sep. 16, 2015, for corresponding JP Application No. 2012-128834, 12 pages.
(Continued)

*Primary Examiner* — Jason M Mandeville
(74) *Attorney, Agent, or Firm* — Seed IP Law Group LLP

(57) ABSTRACT

A pen-shaped position indicator includes: i) a cylindrical housing; ii) a core received in the cylindrical housing and having a pointer tip extend from a distal end of the cylindrical housing; iii) a resonant circuit comprised of an inductive element and a capacitor and received in the cylindrical housing, wherein an inductance of the inductive element changes in response to a pressure applied to the pointer tip of the core; iv) a connection member received in the cylindrical housing between the inductive element and the capacitor, wherein the connection member includes a distal surface facing the inductive element and a proximal surface facing the capacitor, and the connection member includes a terminal member having a distal end and a proximal end; and v) a first conductor disposed on a distal surface of the capacitor facing the proximal surface of the connection member, wherein the first conductor electrically connects the capacitor, via the at least one terminal of the connection member, to the inductive element.

11 Claims, 20 Drawing Sheets

(51) Int. Cl.
*H01G 5/011* (2006.01)
*H01G 5/04* (2006.01)
*H01G 4/015* (2006.01)
*H01G 5/12* (2006.01)
*H03H 7/01* (2006.01)
*H05K 5/00* (2006.01)
*H05K 5/02* (2006.01)

(52) U.S. Cl.
CPC ............ *H01G 5/011* (2013.01); *H01G 5/04* (2013.01); *H01G 5/12* (2013.01); *H03H 7/0115* (2013.01); *H05K 5/0091* (2013.01); *H05K 5/0217* (2013.01); *G06F 2203/0381* (2013.01)

(58) Field of Classification Search
CPC .......... H01G 4/015; H01G 5/011; H01G 5/04; H01G 5/12; H03H 7/0115; H05K 5/0091; H05K 5/0217
USPC .......................................... 345/156–158, 179
See application file for complete search history.

(56) References Cited

U.S. PATENT DOCUMENTS

| | | | |
|---|---|---|---|
| 5,714,984 A * | 2/1998 | Fukuzaki | G06F 3/03545 178/19.03 |
| 7,511,705 B2 * | 3/2009 | Silk | G06F 1/3203 345/179 |
| 9,297,633 B2 * | 3/2016 | Obata | G06F 3/046 |
| 2002/0070927 A1 * | 6/2002 | Fujitsuka | G01D 5/2006 345/179 |
| 2008/0257613 A1 * | 10/2008 | Katsurahira | G06F 3/03545 178/19.04 |
| 2008/0278888 A1 | 11/2008 | Yang et al. | |
| 2011/0192658 A1 * | 8/2011 | Fukushima | G06F 3/03545 178/19.03 |
| 2012/0068975 A1 * | 3/2012 | Wei | G06F 3/03545 345/179 |
| 2012/0074962 A1 * | 3/2012 | Fukushima | G06F 3/03545 324/661 |
| 2013/0193532 A1 | 8/2013 | Horie et al. | |
| 2016/0162053 A1 * | 6/2016 | Obata | G06F 3/03545 345/179 |

FOREIGN PATENT DOCUMENTS

| | | |
|---|---|---|
| JP | 58-118727 U | 8/1983 |
| JP | 63-197318 A | 8/1988 |
| JP | 01-268010 A | 10/1989 |
| JP | 6-2302468 A | 10/1994 |
| JP | 08250367 | 9/1996 |
| JP | 2002244806 A | 8/2002 |
| JP | 2013156066 A | 8/2013 |
| WO | 01/11637 A1 | 2/2001 |

OTHER PUBLICATIONS

Extended European Search Report, dated Nov. 7, 2013, for corresponding European Application No. 13169697.3-1808, 7 pages.

* cited by examiner

A-A SECTION

FIG.7C 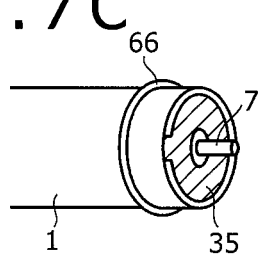 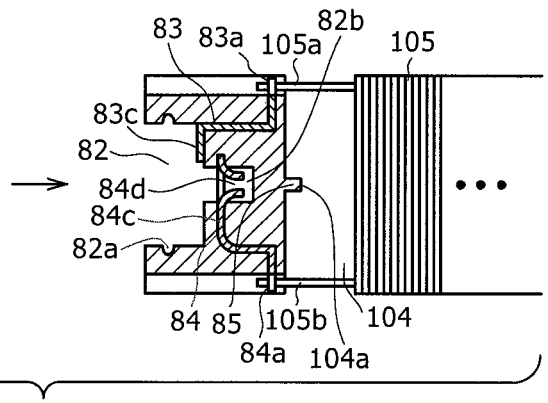

D-D SECTION

FIG.16A
FIG.16B
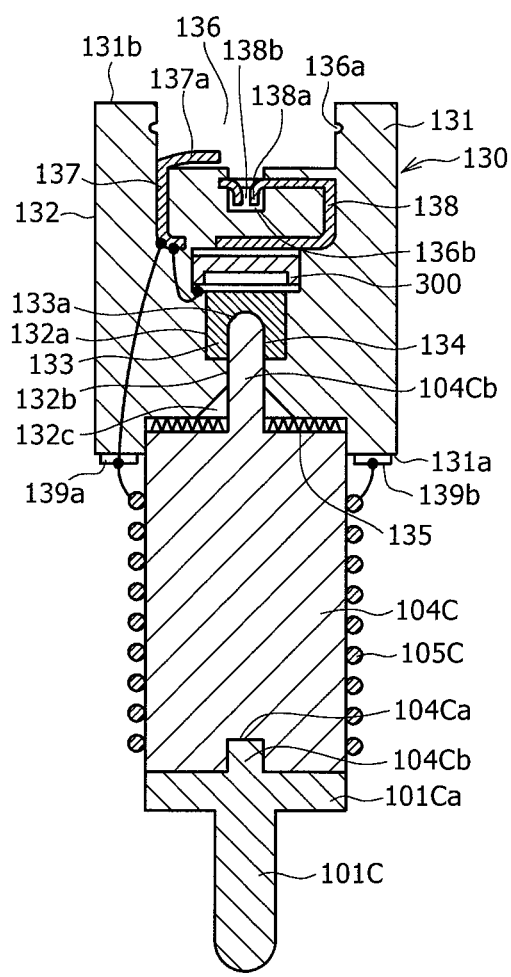
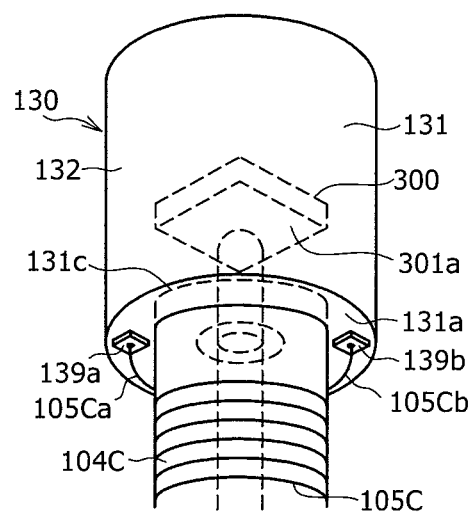

FIG.24  - PRIOR ART -
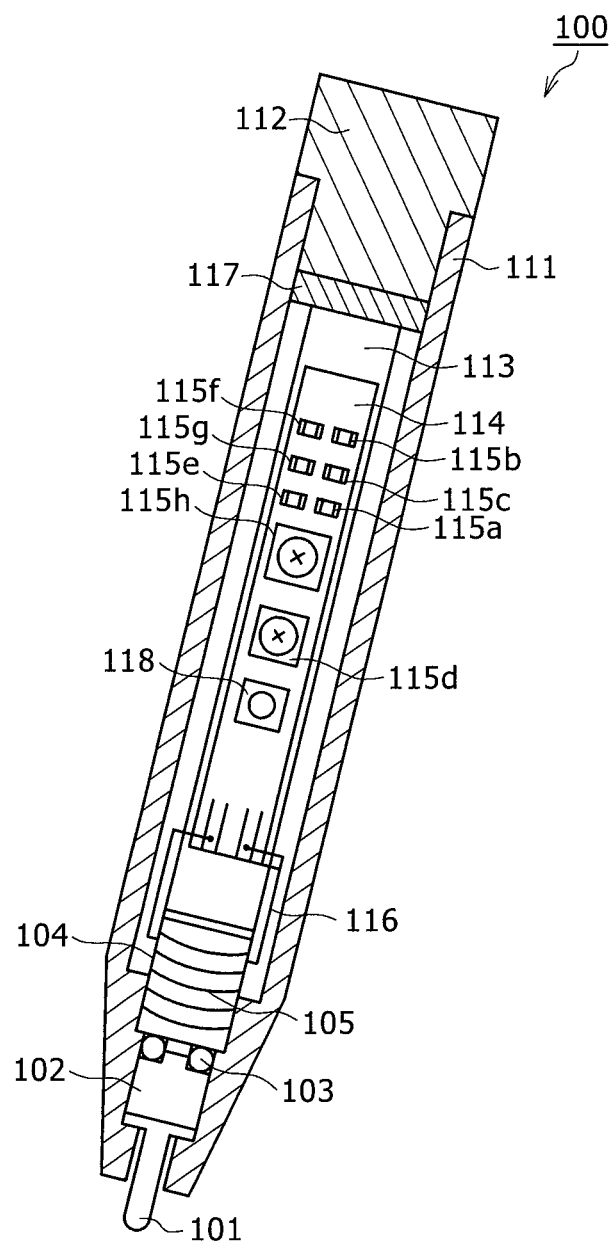

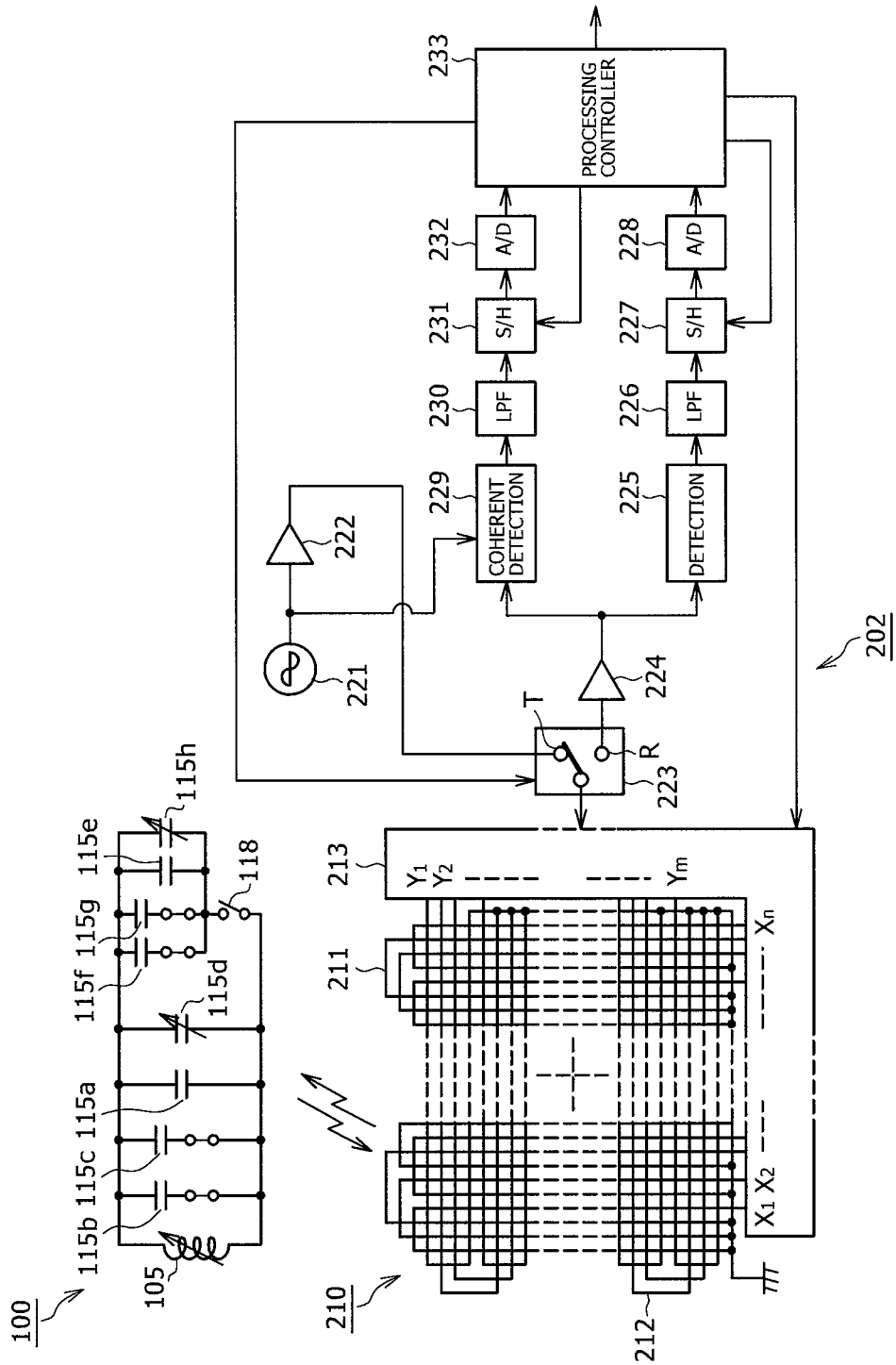
FIG. 25 - PRIOR ART -

PEN-SHAPED POSITION INDICATOR

CROSS-REFERENCE TO RELATED APPLICATION(S)

The present application is a continuation of U.S. application Ser. No. 13/863,220 filed Apr. 15, 2013 which claims priority under 35 U.S.C. 119(a) of Japanese Application No. 2012-128834, filed Jun. 6, 2012, the entire content of which is incorporated herein by reference.

BACKGROUND

Technical Field

This invention relates to a capacitor, particularly to a film capacitor that is suitable to be used as, e.g., a capacitor for setting the resonant frequency of a resonant circuit or a capacitor for setting the tuning frequency of a tuned circuit, and allows change or adjustment of the capacitance value.

Description of the Related Art

A coordinate input device of an electromagnetic induction system is configured with a position detecting device, which includes a sensor in which a large number of loop coils are disposed along the X-axis direction and the Y-axis direction of coordinate axes, and a pen-shaped position indicator, which has a resonant circuit composed of a coil wound around a magnetic core and a capacitor, as disclosed in patent document 1 (Japanese Patent Laid-open No. 2002-244806), for example.

The position detecting device supplies a transmission signal with a predetermined frequency to the loop coil of the sensor, to be transmitted to the position indicator as electromagnetic energy. The resonant circuit of the position indicator is so configured as to have a resonant frequency according to the frequency of the transmission signal and stores the electromagnetic energy based on electromagnetic induction between the resonant circuit and the loop coil of the sensor. Then, the position indicator returns the electromagnetic energy stored in the resonant circuit to the loop coil of the sensor of the position detecting device.

The loop coil of the sensor detects this electromagnetic energy from the position indicator. The position detecting device detects the coordinate values in the X-axis direction and the Y-axis direction on the sensor, indicated by the position indicator, based on the position of the loop coil that has supplied the transmission signal and the position of the loop coil that has detected the electromagnetic energy from the resonant circuit of the position indicator.

This kind of position indicator has such a configuration that a force applied to the core body of the pen-shaped position indicator, i.e., a writing pressure, is transmitted to the position detecting device as a change in the resonant frequency (or the phase) of the resonant circuit, such that the position detecting device can detect the writing pressure. As the configuration to change the resonant frequency of the resonant circuit in association with this writing pressure, there are two types: a type of changing the inductance value of the resonant circuit in association with the writing pressure, and a type of changing the capacitance of the capacitor of the resonant circuit in association with the writing pressure.

The position indicator described in the above-described patent document 1 is one example of the type of changing the inductance value of the resonant circuit. FIG. 24 shows the schematic configuration of one example of a related-art pen-shaped position indicator 100 of this type. The position indicator 100 of this example of FIG. 24 has, in a hollow cylindrical chassis (case) 111, a ferrite core 104 as a magnetic core, around which a coil 105 forming a resonant circuit is wound, and a ferrite chip 102 as an example of a magnetic body used for changing the inductance value. In addition, the position indicator 100 includes plural capacitors 115a to 115h for resonance, which are connected in parallel with respect to the coil 105.

FIG. 24, which is a sectional view of the position indicator 100, shows the state in which the coil 105 is wound around the ferrite core 104 for explanation. As shown in FIG. 24, the position indicator 100 has a configuration in which the ferrite core 104, around which the coil 105 is wound, and the ferrite chip 102 are opposed to each other with the intermediary of an O-ring 103, and the ferrite chip 102 gets closer to the ferrite core 104 due to application of pressing force (writing pressure) to a core body 101. The O-ring 103 used here is a ring-shaped elastic member obtained by forming an elastic material such as synthetic resin or synthetic rubber into the shape of an alphabetical character "0."

Furthermore, in the case 111 of the position indicator 100, the following parts are housed besides the above-described parts: a printed board 114 on which the above-described plural capacitors 115a to 115h for resonance are disposed; a board holder 113 to hold this printed board; a connecting line 116 for connecting the coil 105 to the capacitors 115a to 115h for resonance on the printed board 114 to form a resonant circuit; and a buffering member 117. The positions of them are fixed by a cap 112.

When the ferrite chip 102, against which the core body 101 serving as the pen tip abuts, is brought closer to the ferrite core 104 according to pressing force applied to the core body 101, the inductance of the coil 105 wound around the ferrite core 104 changes in association with this, so that the phase (resonant frequency) of electromagnetic waves transmitted from the coil 105 of the resonant circuit changes. The position detecting device detects the change in the phase (resonant frequency) of the electromagnetic waves received from the position indicator by the loop coil to thereby detect the writing pressure applied to the core body of the position indicator.

Furthermore, in the example of FIG. 24, a push switch 118 as a switch circuit is provided on the printed board 114. A pressing part exposed to the outside of the case 111 through a penetrating hole (not shown) made in the side surface of the case 111 is pressed by the user. Thereby, this push switch 118 is turned on/off. This push switch 118 controls connection/disconnection of the capacitors 115e to 115h among the plural capacitors 115a to 115h for resonance to/from the resonant circuit as described later. Therefore, the capacitance value of the capacitor connected in parallel in the resonant circuit is changed by turning on/off the push switch 118. Thus, the phase (resonant frequency) of the electromagnetic waves transmitted from the coil of the resonant circuit to the position detecting device changes.

The position detecting device can detect the operation of the push switch 118 of the position indicator 100 by detecting the change in the phase (frequency) of the electromagnetic waves received from the position indicator 100 by the loop coil. The on/off-operation of the push switch 118 detected by the position detecting device is assigned various functions, such as a decision (confirmation) operation input, for an electronic apparatus such as a personal computer that incorporates or is externally connected to the position detecting device.

A circuit configuration example of the position detecting device that detects the indicated position and the writing pressure by using the above-described position indicator 100 will be described with reference to FIG. 25. FIG. 25 is a block diagram showing a circuit configuration example of the position indicator 100 and a position detecting device 202 included in a portable apparatus such as a smartphone.

The position indicator 100 includes a resonant circuit composed of the coil 105 and the capacitors 115a to 115h. As described above, the coil 105 is wound around the ferrite core 104 and its inductance value changes depending on the distance from the ferrite chip 102.

In the position indicator 100, the capacitance value of the capacitor connected in parallel to the coil 105 changes in association with turning-on/off of the push switch 118 and thus the resonant frequency of the resonant circuit changes as described above. The position detecting device 202 detects the shift of the resonant frequency (phase) of the resonant circuit of the position indicator 100 to thereby perform detection of writing pressure to be described later and detection of operation of the push switch 118.

The inductance value of the coil 105 wound around the ferrite core 104 varies amongst different units. Therefore, the resonant circuit of the position indicator 100 is so configured that the accurate resonant frequency is obtained through adjustment of the capacitance of the capacitor connected in parallel to the coil 105. Furthermore, in the case of the position indicator including the above-described push switch 118, the resonant frequency when the push switch 118 is in the off-state and the resonant frequency when it is in the on-state also need to be each adjusted.

As shown in FIG. 25, in the resonant circuit of the position indicator 100, the capacitors 115a to 115d among the capacitors 115a to 115h are capacitors for being connected in parallel to the coil 105 to configure the resonant circuit when the push switch 118 is in the off-state. The capacitor 115a has comparatively high capacitance, specifically, for example, 3000 pF, and is always connected in parallel to the coil 105 to define the rough resonant frequency of the resonant circuit when the push switch 118 is in the off-state.

The capacitors 115b and 115c have capacitance equal to or lower than $\frac{1}{10}$ of the capacitance of the capacitor 115a for example, and have such a configuration that whether to connect them in parallel to the coil 105 and the capacitor 115a can be controlled by selectively connecting them by a jumper line. Based on whether or not to connect these capacitors 115b and 115c in parallel to the capacitor 115a, variation in the inductance value of the coil 105 is corrected also in consideration of variation in the capacitance value of the respective capacitors (115a, 115b, 115c). Thereby, the resonant frequency of the resonant circuit when the push switch 118 is in the off-state is adjusted.

Moreover, the capacitor 115d is a trimmer capacitor whose capacitance can be changed by operating a capacitance adjustment knob and is connected in parallel to the coil 105 and the capacitor 115a. Fine adjustment of the capacitance is performed in a range of, for example, about 5 to 45 pF by operating the capacitance adjustment knob of this trimmer capacitor 115d. This allows fine adjustment of the resonant frequency of the resonant circuit when the push switch 118 is in the off-state.

When the push switch 118 is turned on, in addition to the capacitors 115a to 115d, the capacitors 115e to 115h are further connected in parallel to configure the resonant circuit with the coil 105.

In this case, the capacitor 115e has capacitance of, for example, 330 pF and is to define the rough resonant frequency of the resonant circuit when the push switch 118 is in the on-state.

The capacitors 115f and 115g have such a configuration that whether to connect them in parallel to the coil 105 and the capacitor 115a together with the capacitor 115e when the push switch 118 is in the on-state can be controlled by selectively connecting them by a jumper line. Based on whether or not to connect these capacitors 115f and 115g in parallel to the capacitor 115e, variation in the inductance value of the coil 105 is corrected also in consideration of variation in the capacitance value of the respective capacitors (115e, 115f, 115g). Thereby, the resonant frequency of the resonant circuit when the push switch 118 is in the on-state is adjusted.

Moreover, the capacitor 115h is a trimmer capacitor whose capacitance can be changed by operating a capacitance adjustment knob. Fine adjustment of the capacitance is performed in a range of, for example, about 5 to 45 pF by operating the capacitance adjustment knob of this trimmer capacitor 115h. This allows fine adjustment of the resonant frequency of the resonant circuit when the push switch 118 is in the on-state.

The position detecting device 202 performs signal exchange by electromagnetic induction with the resonant circuit of the position indicator 100, for which the resonant frequency is adjusted in the above-described manner, to thereby detect writing pressure and turning-on/off of the push switch in the following manner.

In the position detecting device 202, a position detection coil 210 is formed by stacking plural, specifically n in this example, X-axis-direction loop coils 211 and plural, specifically m in this example, Y-axis-direction loop coils 212 on each other. The respective loop coils configuring the plural X-axis-direction loop coils 211 and the plural Y-axis-direction loop coils 212 are so disposed as to be arranged at equal intervals from each other and to sequentially overlap with each other.

Furthermore, in the position detecting device 202, a selection circuit 213 is provided, to which the respective X-axis-direction loop coils 211 and the respective Y-axis-direction loop coils 212 are connected.

Moreover, the following units are provided in the position detecting device 202: an oscillator 221, a current driver 222, a switch connection circuit 223, a receiving amplifier 224, a detector 225, a low-pass filter 226, a sample/hold circuit 227, an A/D conversion circuit 228, a coherent detector 229, a low-pass filter 230, a sample/hold circuit 231, an A/D conversion circuit 232, and a processing controller 233. The processing controller 233 is configured by a microcomputer.

The oscillator 221 generates an alternating current (AC) signal with a frequency f0. The oscillator 221 supplies the generated AC signal to the current driver 222 and the coherent detector 229. The current driver 222 converts the AC signal supplied from the oscillator 221 to a current and sends it out to the switch connection circuit 223. The switch connection circuit 223 switches the connection target (transmission-side terminal T, reception-side terminal R), to which the loop coil selected by the selection circuit 213 is connected, under control from the processing controller 233. Of these connection targets, the transmission-side terminal T is connected to the current driver 222 and the reception-side terminal R is connected to the receiving amplifier 224.

An induced voltage generated in the loop coil selected by the selection circuit 213 is sent to the receiving amplifier 224 via the selection circuit 213 and the switch connection circuit 223. The receiving amplifier 224 amplifies the induced voltage supplied from the loop coil and sends out the amplified voltage to the detector 225 and the coherent detector 229.

The detector 225 detects the induced voltage generated in the loop coil, i.e., a reception signal, and sends it out to the low-pass filter 226. The low-pass filter 226 has a cutoff frequency sufficiently lower than the above-described frequency f0. It converts the output signal of the detector 225 to a direct current (DC) signal and sends it out to the sample/hold circuit 227. The sample/hold circuit 227 holds the output signal of the low-pass filter 226 and sends it out to the A/D (analog to digital) conversion circuit 228. The A/D conversion circuit 228 converts the analog output of the sample/hold circuit 227 to a digital signal and outputs it to the processing controller 233.

The coherent detector 229 performs coherent detection of the output signal of the receiving amplifier 224 with an AC signal from the oscillator 221 and sends out a signal having the level depending on the phase difference between them to the low-pass filter 230. This low-pass filter 230 has a cutoff frequency sufficiently lower than the frequency f0. It converts the output signal of the coherent detector 229 to a DC signal and sends it out to the sample/hold circuit 231. This sample/hold circuit 231 holds the output signal of the low-pass filter 230 and sends it out to the A/D (analog to digital) conversion circuit 232. The A/D conversion circuit 232 converts the analog output of the sample/hold circuit 231 to a digital signal and outputs it to the processing controller 233.

The processing controller 233 controls the respective units of the position detecting device 202. Specifically, the processing controller 233 controls selection of the loop coil in the selection circuit 213, switching of the switch connection circuit 223, and the timing of the sample/hold circuits 227 and 231. Based on the input signals from the A/D conversion circuits 228 and 232, the processing controller 233 transmits radio waves from the X-axis-direction loop coils 211 and the Y-axis-direction loop coils 212 for a certain transmission continuation time.

An induced voltage is generated in the X-axis-direction loop coils 211 and the Y-axis-direction loop coils 212 by radio waves transmitted from the position indicator 100. The processing controller 233 calculates the coordinate values of the indicated position by the position indicator 100 along the X-axis direction and the Y-axis direction based on the level of the voltage value of this induced voltage generated in the respective loop coils. Furthermore, the processing controller 233 detects whether or not the push switch 118 is operated based on the level of the signal depending on the phase difference between the transmitted radio waves and the received radio waves.

In this manner, in the position detecting device 202, the position of the position indicator 100 that has come close to the position detecting device 202 can be detected by the processing controller 233. In addition, the processing controller 233 of the position detecting device 202 detects the shift of the phase (frequency) of the received signal. Thereby, it can detect the writing pressure applied to the core body of the position indicator 100 and can detect whether or not the push switch 118 is turned on in the position indicator 100.

In the above-described manner, the position detecting device 202 can detect the writing pressure and operation of the push switch 118 by detecting the frequency shift of the resonant frequency (phase) of the resonant circuit of the position indicator 100.

PRIOR ART DOCUMENT

Patent Document

[Patent Document 1]
Japanese Patent Laid-open No. 2002-244806

BRIEF SUMMARY

Problems to be Solved by the Invention

As described above, in the related-art position indicator, one or plural capacitors are connected to the resonant circuit and fine adjustment is performed by a trimmer capacitor in order to correct variation in the resonant frequency of the resonant circuit due to variation in the inductance value of the coil and variation in the capacitance value of the capacitor itself.

This causes the following problems. Specifically, plural capacitors are needed to adjust the resonant frequency of the resonant circuit of the position indicator and the cost is increased corresponding to the number of these plural capacitors. In addition, it takes a lot of labor to connect the capacitor to the resonant circuit by a jumper line. Furthermore, there is a problem that the space to dispose the plural capacitors is necessary and the size of the position indicator increases. In particular, the trimmer capacitor for fine adjustment of the resonant frequency of the resonant circuit of the position indicator is an electronic component having a comparatively large shape and its component cost is also high.

Furthermore, in the case of the position indicator including the push switch as a switch circuit, the resonant frequencies when the push switch is in the on-state and when it is in the off-state need to be adjusted by different capacitor groups and the cost increases corresponding to this. In addition, there is also a problem that the place to dispose the capacitor groups needs to be ensured.

According to one aspect of this invention, a capacitor is provided that can avoid the above-described problems and allows adjustment of the capacitance value.

Means for Solving the Problems

To solve the above-described problems, this invention provides a capacitor including a dielectric film, a first conductor layer and a second conductor layer which are disposed opposed to each other with the intermediary of the dielectric film and are wound into a rod shape, a first electrode led out from the first conductor layer, and a second electrode led out from the second conductor layer.

In the capacitor, a first area-changeable conductor pattern for allowing change in the conductor area of at least one conductor layer of the first conductor layer and the second conductor layer disposed on the outer circumference side of the capacitor wound into the rod shape is formed in the conductor layer in such a manner as to be capable of being subjected to physical treatment from outside, and the capacitor has a value of capacitance corresponding to the change in the conductor area of the conductor layer.

According to the capacitor with the above-described configuration, by giving physical treatment of, for example, dividing or connecting the first area-changeable conductor pattern from outside in the capacitor wound into the rod shape, the conductor area of the conductor layer in which this first area-changeable conductor pattern is formed can be changed. Therefore, according to the capacitor by this invention, by giving physical treatment to the first area-changeable conductor pattern from outside, adjustment can be readily performed to make the capacitor have such a capacitance value as to permit the resonant frequency of a resonant circuit to be set to the desired frequency, for example.

Effect of the Invention

According to this invention, by giving physical treatment to the first area-changeable conductor pattern from outside, the desired capacitance value can be easily set for the capacitor. Therefore, if the capacitor according to this invention is used for, for example, the above-described resonant circuit and tuned circuit, the resonant frequency and the tuning frequency can be optimized by the single capacitor.

BRIEF DESCRIPTION OF THE SEVERAL VIEWS OF THE DRAWINGS

FIGS. 7A to 7C are diagrams for explaining the application example of the first embodiment of the capacitor according to this invention.

FIGS. 16A and 16B are diagrams for explaining yet another application example of the embodiments of the capacitor according to this invention.

FIG. 24 is a diagram showing a configuration example of one example of a related-art position indicator.

FIG. 25 is a diagram for explaining the configuration example of one example of the related-art position indicator.

DETAILED DESCRIPTION

First Embodiment

FIGS. 1A to 4 are diagrams for explaining a configuration example of a first embodiment of the capacitor according to this invention. A capacitor 1 of this first embodiment is based on the supposition that it is used as a capacitor configuring a resonant circuit of a position indicator that has the above-described pen shape and includes the above-described push switch as a switch circuit.

Figure 1A:
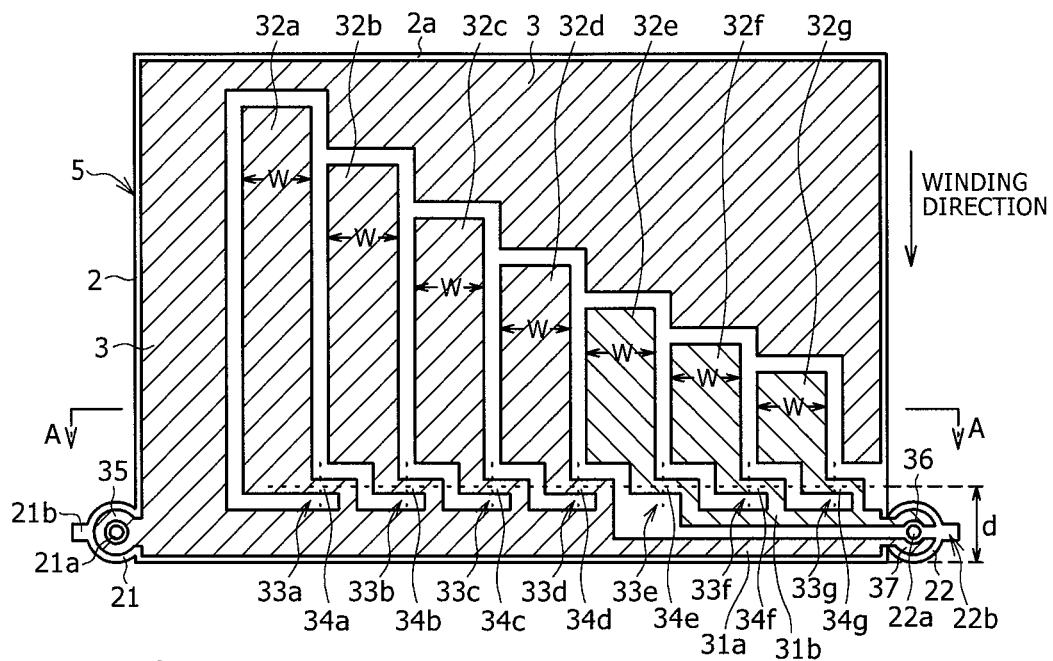
FIGS. 1A to 1C are diagrams for explaining a configuration example of a first embodiment of a capacitor according to this invention.
Figure 1B:
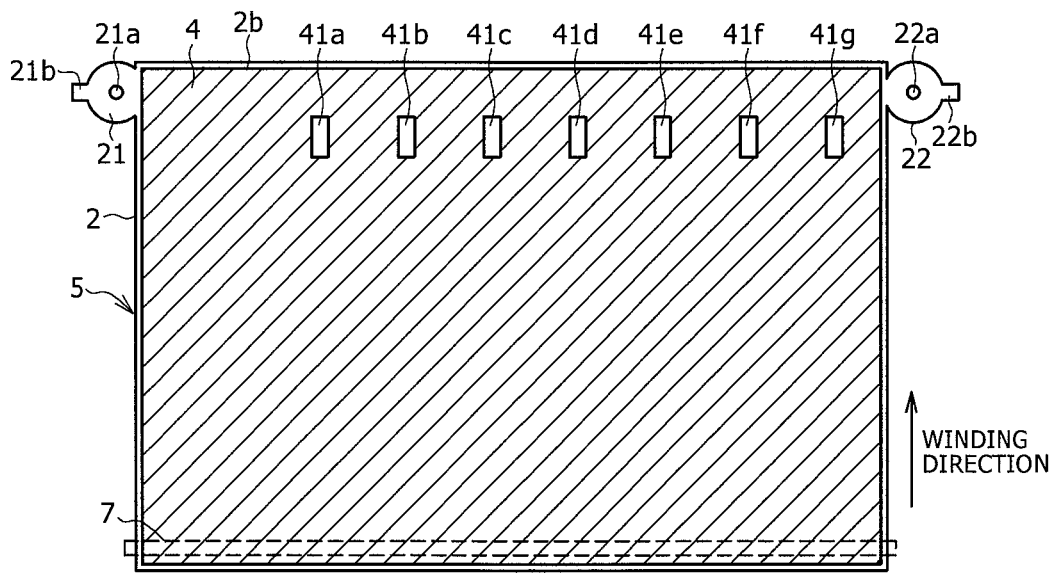
Figure 1C:
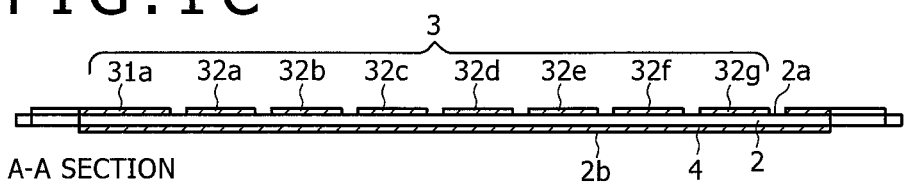

The capacitor 1 of this first embodiment is a so-called film capacitor. The film capacitor 1 is obtained by winding a film capacitor 5, which is obtained by forming a first conductor layer 3 and a second conductor layer 4 disposed opposed to each other with the intermediary of a dielectric film 2 on the front and back surfaces of this dielectric film 2 by, for example, evaporation as shown in FIGS. 1A to 1C, and an insulating film 6 shown in FIG. 2, as shown in FIG. 3, so that the capacitor 1 is configured as a rod-shaped component like that shown in FIG. 4. In the example of the diagram, the horizontal direction of the dielectric film 2 that is long in the horizontal direction is defined as the axial core direction of the winding and the vertical direction of the dielectric film 2 is defined as the winding direction. However, this is for convenience of explanation. For example, the horizontal direction of the dielectric film 2 that is long in the vertical direction may be defined as the axial core direction of the winding, of course.

The dielectric film 2 and the insulating film 6 are formed of a dielectric such as polyethylene terephthalate (PET), polypropylene, polyethylene naphthalate, polyphenylene sulfide, or polycarbonate. The first conductor layer 3 and the second conductor layer 4 are formed of, for example, a metal layer of aluminum, zinc, or an alloy of them and are formed on the dielectric film 2 by metal evaporation.

FIG. 1B shows the side of a back surface 2b of the dielectric film 2, and the second conductor layer 4 is formed across almost the entire surface thereof. FIG. 1A shows the side of a front surface 2a of the dielectric film 2, and the first conductor layer 3 formed of a conductor pattern to be subjected to physical treatment from outside to change its conductor area. Therefore, the film capacitor 5, in which the first conductor layer 3 and the second conductor layer 4 are formed opposed to each other with the intermediary of the dielectric film 2, has capacitance depending on the conductor area of the first conductor layer 3 that changes the conductor area due to physical treatment from outside, such as division treatment or connection treatment of the conductor pattern. FIG. 1B shows the state in which the dielectric film 2 of FIG. 1A is turned over with its upper and lower ends reversed, and the left and right ends of the dielectric film 2 are the same between FIGS. 1A and 1B.

In this first embodiment, as shown in FIG. 1A, the conductor pattern of the first conductor layer 3 is composed of first and second common conductor patterns 31a and 31b, one or more, specifically seven in this example, capacitance-forming conductor patterns 32a, 32b, 32c, 32d, 32e, 32f, and 32g, and area-changeable conductor patterns 33a, 33b, 33c, 33d, 33e, 33f, and 33g whose number corresponds to the number of capacitance-forming conductor patterns 32a to 32g.

The area-changeable conductor patterns 33a to 33d are formed between the first common conductor pattern 31a and the capacitance-forming conductor patterns 32a to 32d, respectively. The area-changeable conductor patterns 33e to 33g are formed between the second common conductor pattern 31b and the capacitance-forming conductor patterns 32e to 32g, respectively. Furthermore, the area-changeable conductor patterns 33a to 33g are formed at positions on the outer circumference side of the wound part of the rod-shaped capacitor 1, preferably on the outermost circumferential surface side, so that they can be subjected to physical treatment in the rod-shaped capacitor 1 after the capacitor 1 is made as a completed component.

In this first embodiment, the area-changeable conductor patterns 33a to 33g include axially-disposed conductor patterns 34a, 34b, 34c, 34d, 34e, 34f, and 34g, respectively, extended along the axial core direction of the capacitor 1 formed by being wound into a rod shape. After the capacitor 1 is made as the completed component, these axially-disposed conductor patterns 34a to 34g are physically divided, corresponding to the desired capacitance value in the rod-shaped capacitor 1, along the direction perpendicular to the extension direction thereof (i.e., circumferential direction of the capacitor 1), as shown by the dotted line in FIG. 1A. Thereby, the capacitance-forming conductor patterns 32a to 32d and the first common conductor pattern 31a, and the capacitance-forming conductor patterns 32e to 32g and the second common conductor pattern 31b are each set to a state of being electrically disconnected or connected. Thus, the conductor area of the first conductor layer 3 forming the capacitance of the capacitor 1 is changed.

Figure 4:
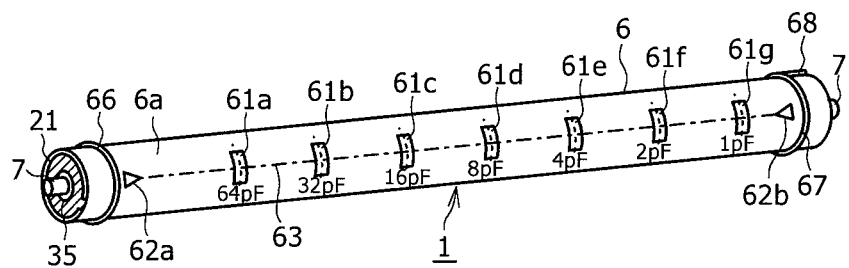
FIG. 4 is a diagram for explaining the configuration example of the first embodiment of the capacitor according to this invention.

Furthermore, in this example, as shown in FIG. 1A, the axially-disposed conductor patterns 34a to 34g configuring the area-changeable conductor patterns 33a to 33g are disposed at positions separate from the winding-finish end of the winding direction of the dielectric film 2 by a predetermined distance d in such a manner as to be arranged in one row and at equal intervals along the horizontal direction of the dielectric film 2, i.e., the axial core direction of the capacitor 1. As a result, in the rod-shaped capacitor 1, the axially-disposed conductor patterns 34a to 34g configuring the area-changeable conductor patterns 33a to 33g are disposed at the same position in the circumferential direction of the capacitor 1 in such a manner as to be arranged in one row along the axial core direction of the capacitor 1. In this case, the predetermined distance d is so selected as to satisfy $d < 2\pi r$ when the radius of the capacitor 1 of this example wound into a rod shape as shown in FIG. 4 is defined as r so that all of the axially-disposed conductor patterns 34a to 34g may be located at the outermost circumferential part of the rod-shaped capacitor 1.

Moreover, in this example, each of the axially-disposed conductor patterns 34a to 34g configuring the area-changeable conductor patterns 33a to 33g is so formed that each of the capacitance-forming conductor patterns 32a to 32g can be individually separated from the first common conductor pattern 31a or the second common conductor pattern 31b.

Each of the capacitance-forming conductor patterns 32a to 32g is formed as a strip-shaped conductor pattern in this example. The widths (lengths in the horizontal direction of the dielectric film 2) W of the conductor patterns are so selected as to be equal to each other. In addition, the conductor patterns are so formed that the lengths in the winding direction of the capacitor 1 are different from each other as shown in FIG. 1A. Therefore, each of the capacitance-forming conductor patterns 32a to 32g is formed as a conductor region with a different area. Furthermore, an insulating part is formed among the capacitance-forming conductor patterns 32a to 32g except for the parts of the area-changeable conductor patterns 33a to 33g.

As described above, the second conductor layer 4 is uniformly formed on the side of the back surface 2b of the dielectric film 2. Thus, each of the capacitance-forming conductor patterns 32a to 32g is opposed to the second conductor layer 4 with the intermediary of the dielectric film 2 to thereby form a capacitor with capacitance according to its area.

As shown in FIG. 1B, in the second conductor layer 4 on the side of the back surface 2b of the dielectric film 2, non-conductor regions 41a to 41g are defined, in which the conductor layer 4 is not formed, at the positions corresponding to the positions of the axially-disposed conductor patterns 34a to 34g, which are possibly divided (severed) in the area-changeable conductor patterns 33a to 33g of the first conductor layer 3 on the side of the front surface 2a after the capacitor 1 is completed. The reason why these non-conductor regions 41a to 41g are set is as follows. Specifically, when division of the conductor layer is performed in the axially-disposed conductor patterns 34a to 34g forming the area-changeable conductor patterns 33a to 33g, electrical connection of the conductor layer 3 on the side of the front surface 2a to the conductor layer 4 on the side of the back surface 2b possibly occurs in association with the division treatment if the conductor layer 4 exists at the respective positions on the side of the back surface 2b corresponding to the axially-disposed conductor patterns 34a to 34g. Therefore, the non-conductor regions 41a to 41g are set in order to prevent the occurrence of such a situation.

The first common conductor pattern 31a is formed across most of the remaining region outside the capacitance-forming conductor patterns 32a to 32g on the front surface 2a of the dielectric film 2. Furthermore, in this example, the capacitance-forming conductor patterns 32a to 32d among the plural capacitance-forming conductor patterns 32a to 32g are treated as a first group and are coupled to the first common conductor pattern 31a via their respective area-changeable conductor patterns 33a to 33d. This first common conductor pattern 31a is also opposed to the second conductor layer 4 on the side of the back surface 2b with the intermediary of the dielectric film 2 and forms a capacitance value depending on its area.

The capacitance-forming conductor patterns 32e to 32g among the plural capacitance-forming conductor patterns 32a to 32g are treated as a second group and are coupled to the second common conductor pattern 31b via their respective area-changeable conductor patterns 33e to 33g.

In this example, circular projections 21 and 22 are formed in the dielectric film 2. When the dielectric film 2 is wound into a rod shape to be configured as the capacitor 1, the circular projections 21 and 22 serve as lid parts at both ends in the winding axial core direction. These circular projections 21 and 22 are regions utilized as electrode lead-out parts of the capacitor 1 of this example in the dielectric film 2. In this example, they are formed at positions on the winding-finish end side when the dielectric film 2 is wound into a rod shape and at both left and right ends in the axial core direction.

Furthermore, in the capacitor 1 of this first embodiment, a ring-shaped electrode conductor 35 is formed on the circular projection 21 as shown in FIG. 1A. This ring-shaped electrode conductor 35 is extended from the first common conductor pattern 31a coupled to the capacitance-forming conductor patterns 32a to 32d of the first group, in the first conductor layer 3 formed on the front surface 2a of the dielectric film 2.

On the circular projection 22, a substantially-half-ring-shaped electrode conductor 36 extended from the second common conductor pattern 31b coupled to the capacitance-forming conductor patterns 32e to 32g of the second group is formed. In addition, a substantially-half-ring-shaped electrode conductor 37 extended from the first common conductor pattern 31a is formed. These conductors 36 and 37 are not connected to each other.

Moreover, in the capacitor 1 of this first embodiment, as shown in FIGS. 1B and 3, the dielectric film 2 is wound together with the insulating film 6 with use of an axial core conductor 7 formed of a metal conductor of e.g., copper or aluminum as the center axial core. By using this axial core conductor 7, an electrode of the capacitor is led out from the second conductor layer 4 formed on the back surface 2b of the dielectric film 2. That is, the axial core conductor 7 is pressure-bonded and electrically connected to the second conductor layer 4 as shown by the dotted line in FIG. 1B. The length of this axial core conductor 7 is so selected as to be slightly larger than the horizontal width of the dielectric film 2 so that the axial core conductor 7 may project from both ends in the winding axial core direction.

At the center part of the circular projections 21 and 22 of the dielectric film 2, penetration holes 21a and 22a are formed, through which both ends of the axial core conductor 7 penetrate so that the axial core conductor 7 may be projected and exposed to the external. An insulating region, in which no conductor layer is formed, is formed between the penetration hole 21a and the ring-shaped conductor 35 so that the axial core conductor 7 may be electrically insulated from the ring-shaped conductor 35. Similarly, an insulating region, in which no conductor layer is formed, is formed between the penetration hole 22a and the substantially-half-ring-shaped conductors 36 and 37 so that the axial core conductor 7 may be electrically insulated from the substantially-half-ring-shaped conductors 36 and 37.

When the dielectric film 2 and the insulating film 6 are wound and the rod-shaped capacitor 1 is formed as shown in FIG. 3, for example an adhesive is applied to the respective end surfaces in the axial core direction of this rod-shaped capacitor 1 to thereby seal the capacitor 1 and ensure quality of the moisture resistance and so forth. In addition, the circular projections 21 and 22 are bent toward the respective end surface sides so that both end parts of the axial core conductor 7 penetrating through the penetration holes 21a and 22a of the circular projections 21 and 22 may be projected to the external. The circular projections 21 and 22 are fixed to the respective end surfaces by the applied adhesive. Furthermore, adhesive-applied parts 21b and 22b formed as extensions of the circular projections 21 and 22, respectively, are fixed to the circumferential side surface of the rod-shaped body by an adhesive or the like. Due to this, electrodes of the capacitor are disposed on the circular projections 21 and 22, and the circular projections 21 and 22 function as lid parts for the winding end surfaces of the capacitor 1.

If the dielectric film 2 is wound as it is, the first conductor layer 3 and the second conductor layer 4 on the front and back surfaces thereof are electrically connected to each other. To prevent this, in this example, the insulating film 6 is overlapped on the side of the front surface 2a of the dielectric film 2 to be wound as shown in FIG. 3, so that the capacitor 1 is configured. The insulating film 6 is formed of a plain dielectric film on which no conductor is formed.

Figure 2:
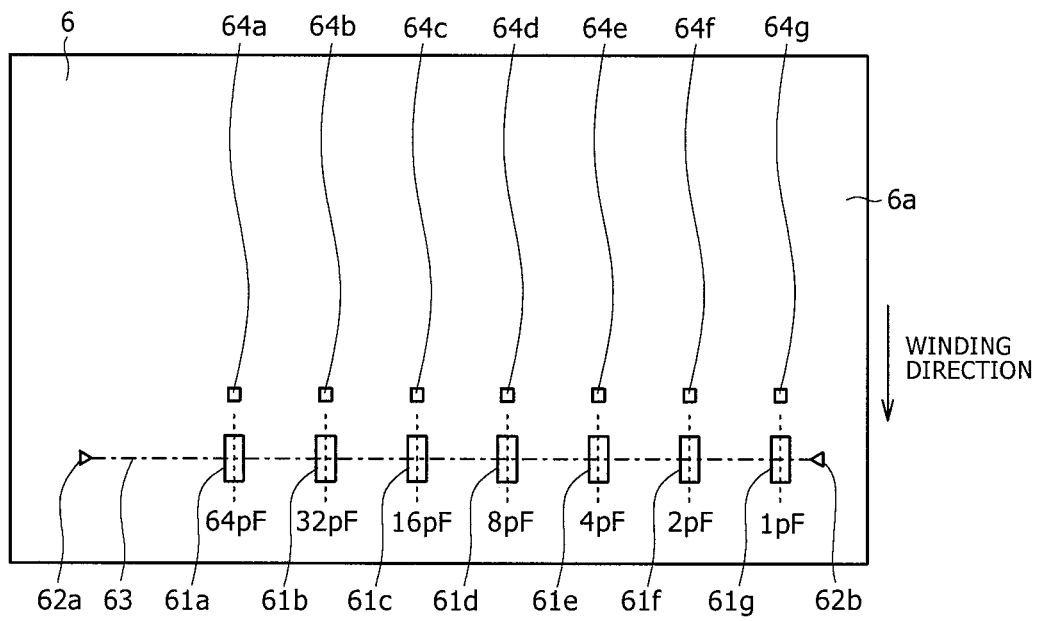
FIG. 2 is a diagram for explaining the configuration example of the first embodiment of the capacitor according to this invention.
Figure 3:
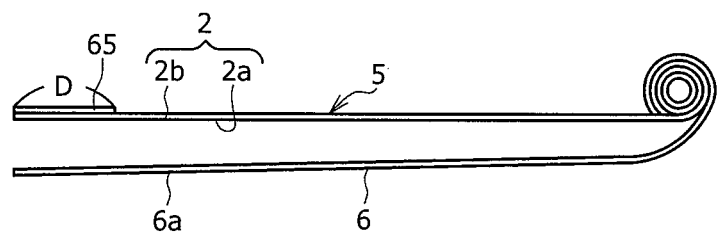
FIG. 3 is a diagram for explaining the configuration example of the first embodiment of the capacitor according to this invention.

Furthermore, as shown in FIG. 2, on the winding-finish end side of the insulating film 6 and on the side of a surface 6a exposed to the external after the winding finish, division marks 61a to 61g are formed by, for example, printing, and are displayed at the positions that correspond to the respective positions of the axially-disposed conductor patterns 34a to 34g configuring the area-changeable conductor patterns 33a to 33g formed in the first conductor layer 3 on the dielectric film 2 when the insulating film 6 is overlapped on the dielectric film 2 and wound as shown in FIG. 3.

Moreover, as shown in FIG. 2, near the respective division marks 61a to 61g, capacitance values corresponding to the respective areas of the capacitance-forming conductor patterns 32a to 32g, which are electrically disconnected and separated when division is performed at the positions of the axially-disposed conductor patterns 34a to 34g configuring the area-changeable conductor patterns 33a to 33g, respectively, are marked by, for example, printing.

When the film capacitor 5 and the insulating film 6 are wound around the axial core conductor 7 as the axial core as shown in FIG. 3, these division marks 61a to 61g and the printed capacitance values are exposed to the outermost circumferential surface of the rod-shaped capacitor 1 as shown in FIG. 4.

As shown in FIG. 1A, the axially-disposed conductor patterns 34a to 34g configuring the area-changeable conductor patterns 33a to 33g are formed at the same position in the circumferential direction of the rod-shaped capacitor 1 in such a manner as to be arranged in one row at equal intervals along the axial core direction of the rod-shaped capacitor 1. Therefore, the division marks 61a to 61g and the capacitance values are arranged in one row at equal intervals along the axial core direction of the rod-shaped capacitor 1 as shown in FIG. 4.

Furthermore, as shown in FIG. 2, circumferential position marks 62a and 62b and a segment mark 63 linking these marks 62a and 62b are formed by, for example, printing, and are displayed on the insulating film 6 in order to indicate the circumferential position of the axially-disposed conductor patterns 34a to 34g configuring the area-changeable conductor patterns 33a to 33g.

Moreover, on the insulating film 6, axial core direction marks 64a to 64g are each formed by, for example, printing, and are displayed at the same position in the axial core direction as that of a respective one of the division marks 61a to 61g and at a position shifted from the respective one of the division marks 61a to 61g by a predetermined length along the circumferential direction of the rod-shaped capacitor 1.

Therefore, although the axially-disposed conductor patterns 34a to 34g configuring the area-changeable conductor patterns 33a to 33g of the film capacitor 5 configured with the first conductor layer 3 and the second conductor layer 4 opposed to each other with the intermediary of the dielectric film 2 are hidden because of the winding of the insulating film 6, division at the area-changeable conductor patterns 33a to 33g can be performed accurately and surely by performing division treatment with the help of all or part of the division marks 61a to 61g, the circumferential position marks 62a and 62b, the segment mark 63, the axial core direction marks 64a to 64g, and the numerical value display of the capacitance values.

The adjustment of the capacitance value of the capacitor 1 may be manually performed by an adjuster person. However, for example, it is also possible to perform division treatment by an automatic machine in the following manner with the help of all or part of the division marks 61a to 61g, the circumferential position marks 62a and 62b, the segment mark 63, the axial core direction marks 64a to 64g, and the numerical value display of the capacitance values.

In this case, the capacitor 1 is so attached that it can be rotated about the axial core conductor 7 as the rotational center axis. Furthermore, a camera for photographing the circumferential side surface of the capacitor 1 and capturing its image is provided. In addition, a division measure formed of a cutter or the like is provided for dividing the axially-disposed conductor patterns 34a to 34g configuring the area-changeable conductor patterns 33a to 33g with the help of the marks such as the division marks 61a to 61g.

First, the capacitance value that should be set in the capacitor 1 after adjustment is obtained in advance and the axially-disposed conductor pattern that should be divided to yield this capacitance value is settled among the axially-disposed conductor patterns 34a to 34g.

Next, the capacitor 1 is rotated about the axial core conductor 7 as the rotational center axis while the image of the circumferential side surface of the capacitor 1 is captured by the camera. Then, the circumferential position at which the axially-disposed conductor patterns 34a to 34g can be divided by the division measure is obtained with the help of the circumferential position marks 62a and 62b and the segment mark 63, and the rotation is stopped at this position.

Next, the axial core direction position of the division measure relative to the capacitor 1 is decided with the help of the axial core direction marks 64a to 64g and the division marks 61a to 61g. Then, the position control of the division measure is carried out to divide only the predefined axially-disposed conductor pattern that should be divided. Then, the capacitor 1 is rotated about the axial core conductor 7 in such a manner that the axial core direction marks 64a to 64g are followed by the division marks 61a to 61g along the circumferential direction, for example, and division of the predefined axially-disposed conductor pattern that should be divided is performed by the division measure. In this division, the capacitance value decreased by the division of the axially-disposed conductor pattern that should be divided can be visually confirmed based on the printed numerical value. The divided part is sealed by a resin material or the like to maintain quality of the moisture resistance and so forth.

The above-described division by the division measure is performed from the side of the surface 6a of the insulating film 6 in FIG. 3. In this example, in order to prevent this division from extending to the wound part underneath the axially-disposed conductor patterns 64a to 64g, a division block sheet 65 having a predetermined length D is formed by deposition near the winding-finish end of the surface 2b of the dielectric film 2 configuring the film capacitor 5 corresponding to the positions at which the axially-disposed conductor patterns are disposed as shown in FIG. 3.

Although a component separate from the insulating film 6 is provided as the division block sheet 65 in the example of FIG. 3, the following way may be employed. Specifically, the insulating film 6 is extended to be longer than the film capacitor 5 by a length D. This extended part of the insulating film 6 with the length D is folded back from the winding-finish end of the film capacitor 5 to cover the winding-finish end side of the surface 2b of the dielectric film 2. Thereby, this folded part is made to play the same role as that of the division block sheet 65. Alternatively, the dielectric film 2 itself may be extended by the length corresponding to the division block sheet and this extended part may be folded back.

As shown in FIG. 4, ring-shaped projections 66 and 67 are formed near both ends in the axial core direction of the rod-shaped capacitor 1. These ring-shaped projections 66 and 67 are to lock the capacitor 1 of the above-described first embodiment by fitting it into coupling members to be described later, which is used when the capacitor 1 is coupled to the ferrite core and so forth.

At the axial end part of the rod-shaped capacitor 1 on the side opposite to the end part at which the electrode conductor 35 is formed, an axial core direction projection 68 for restricting the circumferential position when the capacitor 1 is fitted into the coupling member to be described later is formed. The axial core direction projection 68 is formed from a predetermined circumferential position at the ring-shaped projection 67 along the axial core direction to the axial end part at which the electrode conductors 36 and 37 (not shown in FIG. 4) are formed.

These projections 66 and 67 can be formed by inserting a linear member along the winding direction when the film capacitor 5 and the insulating film 6 are wound into a rod shape. The projection 68 can be formed by inserting a linear member along the direction perpendicular to the winding direction when the film capacitor 5 and the insulating film 6 are wound into a rod shape.

Equivalent Circuit of Capacitor 1

Figure 5:
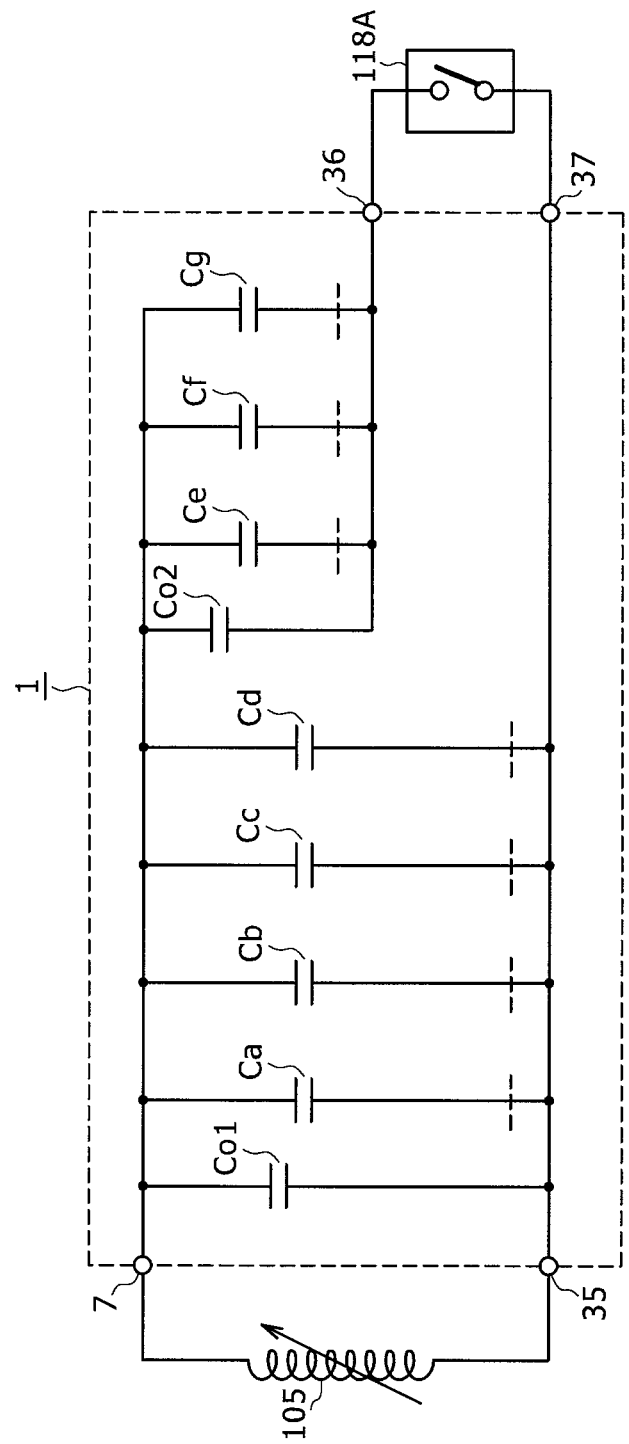
FIG. 5 is a diagram showing an equivalent circuit example of the first embodiment of the capacitor according to this invention.

The equivalent circuit of the capacitor 1 of the first embodiment with the above-described configuration is shown in FIG. 5 and is surrounded by the dotted line. In this FIG. 5, conceptually Co1 and Co2 are capacitances that are formed by opposing of the first common conductor pattern 31a and the second common conductor pattern 31b of the first conductor layer 3, respectively, to the second conductor layer 4 with the intermediary of the dielectric film 2 and that are according to their respective areas. Ca to Cg are capacitances that are formed by opposing of the capacitance-forming conductor patterns 32a to 32g of the first conductor layer 3, respectively, to the second conductor layer 4 with the intermediary of the dielectric film 2 and that are according to their respective areas.

The second conductor layer 4 on the side of the back surface 2b of the dielectric film 2 serves as one electrode (common electrode) of the capacitor configuring the capacitances Co1, Co2, and Ca to Cg, and this common electrode is led out from the axial core conductor 7. Furthermore, as shown in FIG. 1A, the ring-shaped electrode conductor 35 on the circular projection 21 is connected to the first common conductor pattern 31a of the conductor layer 3 formed on the front surface 2a of the dielectric film 2. Thus, the ring-shaped electrode conductor 35 serves as the other electrode of the capacitor configuring the capacitance Co1 and the capacitances Ca to Cd, corresponding to the areas of the first common conductor pattern 31a and the capacitance-forming conductor patterns 32a to 32d of the first group among the capacitance-forming conductor patterns 32a to 32g.

The electrode conductor 35 is connected to the electrode conductor 37 via the first common conductor pattern 31a. Furthermore, the electrode conductor 36 is connected to the second common conductor pattern 31b. Thus, the electrode conductor 36 serves as the other electrode of the capacitor configuring the capacitance Co2 and the capacitances Ce to Cg, corresponding to the areas of the second common conductor pattern 31b and the capacitance-forming conductor patterns 32e to 32g of the second group among the capacitance-forming conductor patterns 32a to 32g.

Therefore, as shown in FIG. 5, the capacitance Co1 according to the area of the first common conductor pattern 31a and the capacitances Ca to Cd according to the areas of the capacitance-forming conductor patterns 32a to 32d are connected in parallel to each other between the axial core conductor 7, which is the electrode connected to the second conductor layer 4, and the ring-shaped electrode conductor 35.

When any of the axially-disposed conductor patterns 34a to 34d configuring the area-changeable conductor patterns 33a to 33d is divided as described above, this divided capacitance among the capacitances Ca to Cd connected in parallel to the capacitor Co1 is cut at the position indicated by the dotted line in FIG. 5 to become disconnected. Thus, the capacitance between the axial core conductor 7 as the electrode and the ring-shaped electrode conductor 35 decreases by this disconnected capacitance.

When the electrode conductor 36 is electrically connected to the electrode conductor 37, the capacitances Co1 and Co2 according to the areas of the first common conductor pattern 31a and the second common conductor pattern 31b and the capacitances Ca to Cg according to the areas of the capacitance-forming conductor patterns 32a to 32g are connected in parallel to each other between the axial core conductor 7, which is the electrode connected to the second conductor layer 4, and the ring-shaped electrode conductor 35.

When any of the axially-disposed conductor patterns 34e to 34g configuring the area-changeable conductor patterns 33e to 33g is divided, this divided capacitance among the capacitances Ce to Cg connected in parallel to the capacitor Co2 is cut at the position indicated by the dotted line in FIG. 5 to become disconnected. Thus, the capacitance of the capacitor 1 decreases by this disconnected capacitance.

Example of Adjustment Method of Resonant Frequency by Adjustment of Capacitance of Capacitor 1

Therefore, for example, when this capacitor 1 is used as the capacitor configuring the resonant circuit of the position indicator for the above-described position detecting device of the electromagnetic induction system, the resonant frequency of the resonant circuit can be adjusted by adjusting the capacitance of this capacitor 1 as described below.

Specifically, the coil 105 is connected between the axial core conductor 7 serving as one electrode of the capacitor 1 and the ring-shaped electrode conductor 35 serving as the other electrode of the capacitor 1, to configure a parallel resonant circuit with the capacitances Co1, Co2, and Ca to Cg of the capacitor 1. In addition, in this example, a push switch 118A as a switch circuit is connected between the electrode conductor 36 and the electrode conductor 37 in advance as described later. In this case, the inductance value of the coil 105 when the writing pressure is zero for example is measured to be acquired in advance.

When the push switch 118A is in the off-state or the push switch 118A is in the non-connected state, i.e., when the electrode conductor 36 is not connected to the electrode conductor 37, the capacitances Co2 and Ce to Cg are isolated from the capacitor 1. In order for the resonant frequency at this time to be a first value, the capacitance that should be connected in parallel to the coil 105 is obtained. Next, the necessary patterns among the axially-disposed conductor patterns 34a to 34d configuring the area-changeable conductor patterns 33a to 33d are subjected to division treatment so that this obtained capacitance may be realized.

Next, when the push switch 118A is in the on-state, i.e., when the electrode conductor 36 is short-circuited to the electrode conductor 37, the capacitances Co2 and Ce to Cg are added to the capacitor 1. In order for the resonant frequency at this time to be a second value, the capacitance that should be connected in parallel to the coil 105 is obtained. Next, the necessary patterns among the axially-disposed conductor patterns 34e to 34g configuring the area-changeable conductor patterns 33e to 33g are subjected to division treatment so that this obtained capacitance may be realized.

In the above description, the capacitor 1 is used for adjustment of the resonant frequency of the resonant circuit in the position indicator similar to the position indicator 100 that has a configuration including the push switch 118A and is used together with the position detecting device of the electromagnetic induction system. Therefore, the configuration in which the push switch 118A is connected between the electrode conductor 36 and the electrode conductor 37 is employed.

However, the capacitor 1 of this invention can be used also in the case of adjusting the resonant frequency of the resonant circuit in a position indicator that does not have a push switch (or side switch) as a switch circuit and is used together with the position detecting device of the electromagnetic induction system. In this case, a configuration may be employed in which the electrode conductor 36 is not short-circuited to the electrode conductor 37 and the capacitances Co2 and Ce to Cg are not used. However, it is possible to short-circuit the electrode conductor 36 to the electrode conductor 37 and selectively use all of the capacitances Co1, Co2, and Ca to Cg of the capacitor 1 as parallel capacitance configuring the resonant circuit. That is, it is possible to provide, with only one capacitor 1, operation and effects equivalent to those provided by a large number of capacitors including the existing trimmer capacitor.

Example of Position Indicator Including Capacitor 1 of First Embodiment

Figure 6:
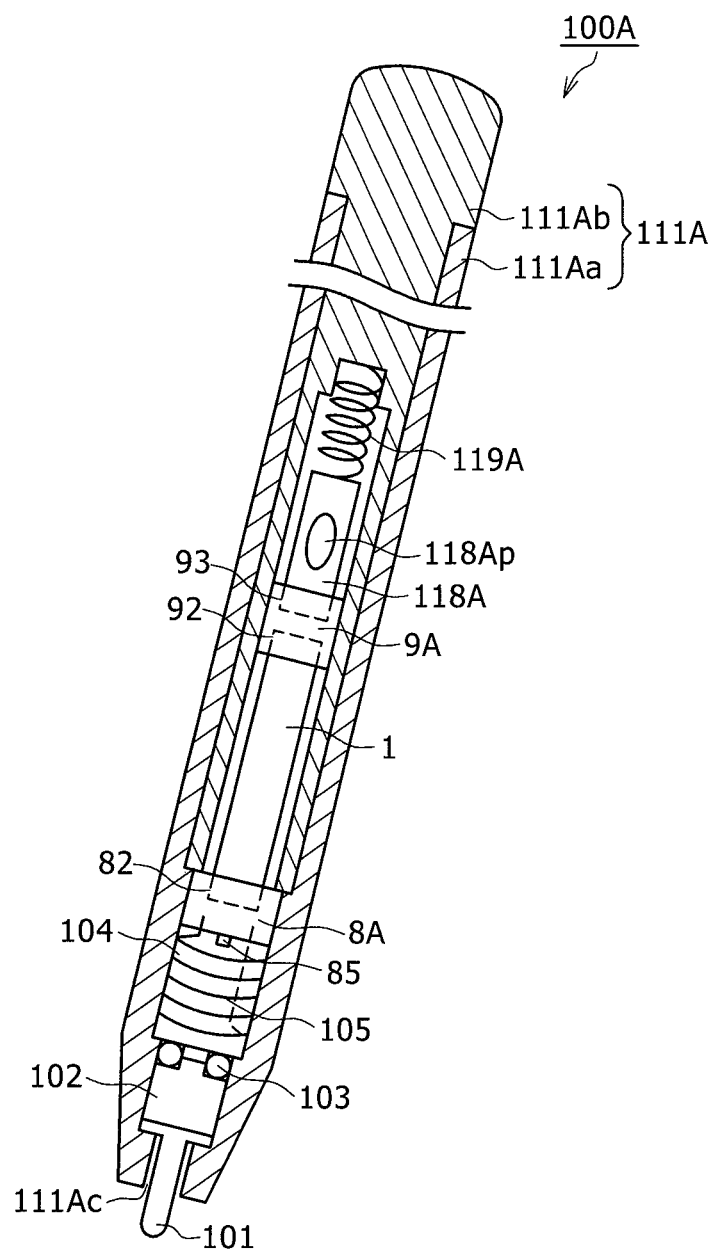
FIG. 6 is a diagram showing an application example of the first embodiment of the capacitor according to this invention.

FIG. 6 shows a configuration example of a position indicator 100A using the capacitor 1 of the above-described first embodiment as the capacitor configuring the resonant circuit. The position indicator 100A of the example of this FIG. 6 is an example of the position indicator used together with the position detecting device of the electromagnetic induction system shown in FIG. 25. The same respective components as those in the position indicator 100 of the example of FIG. 24 are given the same reference numerals and detailed description thereof is omitted. In FIG. 6, a case 111A is shown in cross-section for easy explanation of the configuration within the case 111A.

As shown in FIG. 6, in the position indicator 100A of this example, the case 111A is composed of a hollow cylindrical outside case 111Aa and an inside case 111Ab and has a configuration in which the outside case 111Aa is concentrically fitted to the inside case 111Ab. In the hollow part of the case 111A, members for writing pressure detection, the capacitor 1 of the first embodiment, and the push switch 118A are so housed as to be sequentially arranged along the center line direction of the case 111A.

The push switch 118A used in this example has a columnar chassis shape and a pressing part 118Ap is exposed at the circumferential side surface of this columnar chassis. This pressing part 118Ap is pressed by a finger to thereby turn on/off the switch provided inside the chassis. Furthermore, although not shown in the diagram, a penetration hole that penetrates the outside case 111Aa and the inside case 111Ab and allows the pressing operation part 118Ap of the push switch 118A to be seen from outside is made in the case 111A. Furthermore, at this penetration hole part of the case 111A, a pressing operation element (not shown) to press the pressing operation part 118Ap of the push switch 118A is so provided as to permit pressing operation from outside.

In this example, the members for writing pressure detection have the same configuration as that of the above-described position indicator 100. Specifically, as shown in FIG. 6, similarly to the above-described position indicator 100, the position indicator 100A of this example includes the coil 105, which is one example of an inductance element and is wound around the ferrite core 104, which is one example of a magnetic body, and the ferrite chip 102 opposed to the ferrite core 104 with the intermediary of the O-ring 103 formed of an elastic member. The position indicator 100A has a configuration in which the inductance value of the coil 105 changes depending on the writing pressure applied to the core body 101. The outside case 111Aa has an opening 111Ac for allowing the core body 101 to be projected from the tip part of the position indicator 100A.

In this example, the part of the ferrite core 104 on the opposite side to the core body 101 is coupled to the rod-shaped capacitor 1 by a coupling member 8A. Furthermore, the capacitor 1 is coupled to the push switch 118A by a coupling member 9A. The coupling member 8A mechanistically couples the ferrite core 104 to the capacitor 1 and also electrically connects one end and the other end of the coil 105 wound around the ferrite core 104 to the axial core conductor 7 and the electrode conductor 35, respectively, serving as the electrodes of the capacitor 1. Furthermore, the coupling member 9A mechanistically couples the capacitor 1 to the push switch 118A and also electrically connects the electrode conductor 36 and the electrode conductor 37 of the capacitor 1 to one terminal and the other terminal, respectively, of the push switch 118A.

Figure 7A:
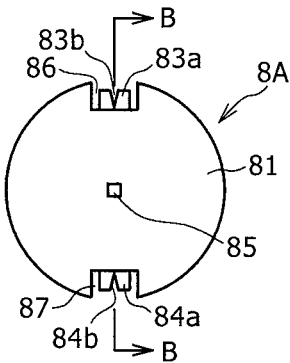
Figure 7B:
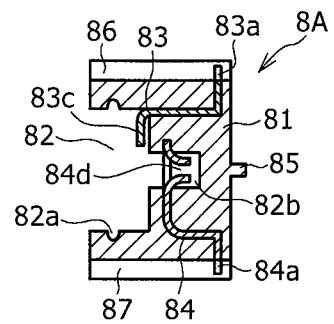

FIGS. 7A to 7C are diagrams for explaining a configuration example of the coupling member 8A. FIG. 7A is a diagram when the coupling member 8A is viewed from the side coupled to the ferrite core 104 and FIG. 7B is a sectional view along line B-B in FIG. 7A. FIG. 7C is a diagram for explaining how the capacitor 1 is coupled to the coupling member 8A coupled to the ferrite core 104.

As shown in FIGS. 7A and 7B, the coupling member 8A is obtained by performing insert molding in the following manner. Specifically, a recess 82 into which the capacitor 1 is fitted is formed in a main body 81 formed of a columnar resin member. In addition, elastic terminal members 83 and 84 for electrically connecting one end 105a and the other end 105b of the coil 105 to the electrode conductor 35 and the axial core conductor 7 of the capacitor 1 are inserted.

The recess 82 is a circular concave hole having an inner diameter almost equal to the outer diameter of the rod-shaped capacitor 1. A ring-shaped concave trench 82a is formed in the sidewall of this recess 82. Into the ring-shaped concave trench 82a, the ring-shaped projection 66 provided at the end part of the rod-shaped capacitor 1 on the side on which the electrode conductor 35 is formed is fitted.

At the coupling part of the main body 81 to the ferrite core 104, a projection 85 for positioning is formed at the center of a flat surface. On the other hand, the end surface of the ferrite core 104 on the side of the coupling member 8A is a flat surface and a positioning recess 104a into which the projection 85 is fitted is formed at the center thereof.

Furthermore, as shown in FIG. 7A, concave trenches 86 and 87 are formed along the center line direction of the column at positions on the circumferential side surface of the main body 81, specifically at positions separate from each other by an angular distance of 180 degrees in this example. In these concave trenches 86 and 87, one end parts 83a and 84a of the terminal members 83 and 84 are vertically disposed along the direction perpendicular to the circumferential direction. In these vertically-disposed one end parts 83a and 84a of the terminal members 83 and 84, V-shaped notches 83b and 84b are formed as shown in FIG. 7A.

In the state in which the projection 85 of the main body 81 of the coupling member 8A is fitted into the recess 104a formed in the end surface of the ferrite core 104 as shown on the right side of FIG. 7C, the end surface of the ferrite core 104 is bonded to the flat surface of the main body 81 of the coupling member 8A by, for example, an adhesive. Furthermore, one end 105a of the coil 105 is press-fitted into the V-shaped notch 83b of one end part 83a of the terminal member 83 and they are electrically connected to each other. In addition, the other end 105b of the coil 105 is press-fitted into the V-shaped notch 84b of one end part 84a of the terminal member 84 and they are electrically connected to each other. The component that is shown on the right side of this FIG. 7C and is obtained by coupling the coupling member 8A to the ferrite core 104 around which the coil 105 is wound can be treated as one ferrite core module.

In the coupling member 8A, the other end part 83c of the terminal member 83 is exposed from the bottom of the concave hole 82. Due to this, as shown in FIG. 7C, the electrode conductor 35 of the capacitor 1 is electrically connected to the terminal member 83 via the end part 83c when the rod-shaped capacitor 1 is inserted in the recess 82.

At the center of the bottom of the recess 82, a concave hole 82b having a diameter larger than that of the axial core conductor 7 of the capacitor 1 is formed. The other end part 84c of the terminal member 84 is located in this concave hole 82b. At the part, at which the other end part 84c of the terminal member 84 is located in this concave hole 82b, an insertion hole 84d is formed, into which the axial core conductor 7 of the capacitor 1 can be inserted. An elastic bent part formed in the terminal member 84 is disposed in the insertion hole 84d.

Therefore, when the capacitor 1 is inserted in the recess 82, the axial core conductor 7 of the capacitor 1 is inserted in the insertion hole 84d to get contact with the elastic bent part, so that the axial core conductor 7 is electrically connected to the terminal member 84. Furthermore, the electrode conductor 35 of the capacitor 1 is electrically connected to the other end part 83c of the terminal member 83. The ring-shaped projection 66 of the capacitor 1 is fitted into the ring-shaped concave trench 82a of the recess 82 of the coupling member 8A and thereby the capacitor 1 is locked by the coupling member 8A. In the state in which the ferrite core 104 around which the coil 105 is wound is coupled to the capacitor 1 by the coupling member 8A in this manner, the electrode conductor 35 and the axial core conductor 7 of the capacitor 1 are connected to one end 105a and the other end 105b, respectively, of the coil 105. This provides the state in which the coil 105 and the capacitor 1 are connected in parallel to each other.

Figure 8A:
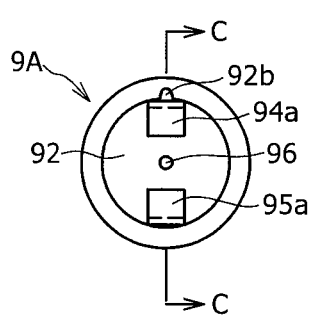
FIGS. 8A to 8E are diagrams for explaining the application example of the first embodiment of the capacitor according to this invention.
Figure 8B:
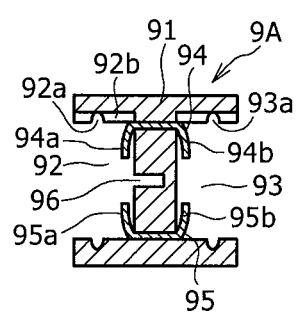
Figure 8C:
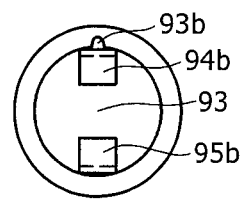
Figure 8D:
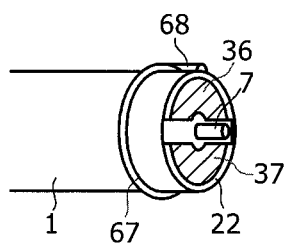
Figure 8E:
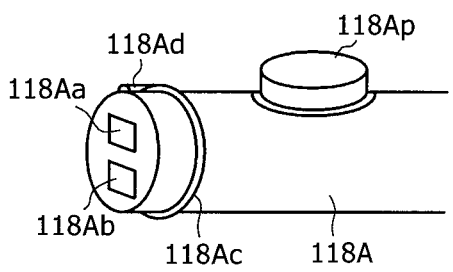

Next, the coupling member 9A will be described. FIGS. 8A to 8E are diagrams for explaining a configuration example of this coupling member 9A. FIG. 8A is a diagram when the coupling member 9A is viewed from the side coupled to the capacitor 1 and FIG. 8B is a sectional view along line C-C in FIG. 8A. FIG. 8C is a diagram when the coupling member 9A is viewed from the side coupled to the push switch 118A. FIG. 8D is a diagram showing the end part of the capacitor 1 on the side coupled to the coupling member 9A. FIG. 8E is a diagram showing the end part of the push switch 118A on the side coupled to the coupling member 9A.

As shown in FIGS. 8A and 8B, the coupling member 9A is obtained by performing insert molding in the following manner. Specifically, a recess 92 into which the capacitor 1 is fitted and a recess 93 into which the push switch 118A is fitted are formed in a main body 91 formed of a columnar resin member. In addition, elastic terminal members 94 and 95 for electrically connecting the electrode conductors 36 and 37 of the capacitor 1 to one and the other terminals of the push switch 118A are inserted.

In this case, the recess 92 is a circular concave hole having a diameter almost equal to the outer diameter of the rod-shaped capacitor 1. In the sidewall of this recess 92, a ring-shaped concave trench 92a and an axial core direction concave trench 92b are formed. The ring-shaped projection 67 (see FIG. 8D) provided at the end part of the rod-shaped capacitor 1 on the side on which the electrode conductors 36 and 37 are formed is fitted into the ring-shaped concave trench 92a. The axial core direction projection 68 (see FIG. 8D) formed in the capacitor 1 is engaged with the axial core direction concave trench 92b. In the bottom surface of this recess 92, a concave hole 96 into which the axial core conductor 7 of the capacitor 1 is inserted is formed. Furthermore, one end parts 94a and 95a of the terminal members 94 and 95 are exposed at the bottom of this recess 92.

The recess 93 is a circular concave hole having a diameter almost equal to the outer diameter of the columnar push switch 118A. In the sidewall of this recess 93, a ring-shaped concave trench 93a and an axial core direction concave trench 93b are formed. A ring-shaped projection 118Ac provided at the end part of the columnar push switch 118A on the side on which one terminal 118Aa and the other terminal 118Ab are formed as shown in FIG. 8E is fitted into the ring-shaped concave trench 93a. An axial core direction projection 118Ad (see FIG. 8E) formed in the push switch 118A is engaged with the axial core direction concave trench 93b. Furthermore, the other end parts 94b and 95b of the terminal members 94 and 95 are exposed at the bottom of this recess 93.

The side of the capacitor 1, where the circular projection 22, on which the electrode conductors 36 and 37 shown in FIG. 8D are formed, forms the end surface, is inserted into the recess 92 of the coupling member 9A in the state in which alignment in the circumferential direction is achieved by the axial core direction projection 68 and the axial core direction concave trench 92b. Thereupon, the axial core conductor 7 of the capacitor 1 is inserted into the concave hole 96 and the electrically-non-contact state thereof is ensured. The electrode conductor 36 of the capacitor 1 is elastically brought into pressure contact with one end part 94a of the terminal member 94 and electrically connected thereto. Similarly, the electrode conductor 37 is elastically brought into pressure contact with one end part 95a of the terminal member 95 and electrically connected thereto. Moreover, the ring-shaped projection 67 of the capacitor 1 is fitted into the ring-shaped concave trench 92a of the recess 92 of the coupling member 9A and thereby the capacitor 1 is locked by the coupling member 9A.

The side of the push switch 118A, where one terminal 118Aa and the other terminal 118Ab of the push switch 118 A shown in FIG. 8E are formed, is inserted into the recess 93 of the coupling member 9A in the state in which alignment in the circumferential direction is achieved by the axial core direction projection 118Ad and the axial core direction concave trench 93b. Thereupon, one terminal 118Aa of the push switch 118A is elastically brought into pressure contact with the other end part 94b of the terminal member 94 and electrically connected thereto. Similarly, the other terminal 118Ab of the push switch 118A is elastically brought into pressure contact with the other end part 95b of the terminal member 95 and electrically connected thereto. Moreover, the ring-shaped projection 118Ac of the push switch 118A is fitted into the ring-shaped concave trench 93a of the recess 93 of the coupling member 9A and thereby the push switch 118A is locked by the coupling member 9A.

In the above-described manner, a structural body is obtained by coupling the ferrite core 104, around which the coil 105 is wound, the capacitor 1, and the push switch 118A to each other by using the coupling member 8A and the coupling member 9A. This structural body is housed in the outside case 111Aa from the opposite side to the opening 111Ac, following the core body 101, the ferrite chip 102, and the O-ring 103. Thereafter, the inside case 111Ab is fitted to the outside case 111Aa, so that the position indicator 100A is formed.

In this example, as shown in FIG. 6, the configuration is so made that the core body 101, the ferrite chip 102, the O-ring 103, the ferrite core 104, around which the coil 105 is wound, and the coupling member 8A are located in the smaller-diameter hollow part of the outside case 111Aa. Furthermore, the inside case 111Ab is fixed after being inserted in the outside case 111Aa in such a manner that the end surface of the coupling member 8A on the side, where the recess 82 into which the capacitor 1 is fitted is formed, abuts against the end part of the inside case 111Ab. Therefore, the ferrite core 104 is restricted from moving to the opposite side to the core body 101 along the axial core direction of the case 111A because of this abutting against the end surface of the inside case 111Ab.

The capacitor 1, the coupling member 9A, and the push switch 118A are located in the hollow part of the inside case 111Ab. Furthermore, a coil spring 119A is disposed on the opposite side to the core body 101 in the hollow part of the inside case 111Ab and the capacitor 1, the coupling member 9A, and the push switch 118A are always biased toward the coupling member 8A by this coil spring 119A. This ensures electrical contact among the respective terminals and prevents the backlash of the respective members configuring the position indicator 100A.

Second Embodiment

In the above-described first embodiment, the capacitances Co1 and Ca to Cd of the first group are separated from the capacitances Co2 and Ce to Cg of the second group by dividing the common conductor patterns and the capacitance-forming conductor patterns into two groups in the first conductor layer 3. However, it is also possible to divide the patterns into two groups in the second conductor layer 4 instead of dividing the patterns into two groups in the first conductor layer 3. The second embodiment is an example of this case.

FIGS. 9A to 10C are diagrams for explaining a configuration example of the second embodiment of the capacitor according to this invention. A capacitor 1B of this second embodiment is also based on the supposition that it is used as a capacitor configuring a resonant circuit of a position indicator that has the above-described pen shape and includes the above-described push switch. In the following description, the same part as that in the above-described first embodiment is given the same reference numeral and detailed description thereof is omitted.

Figure 9A:
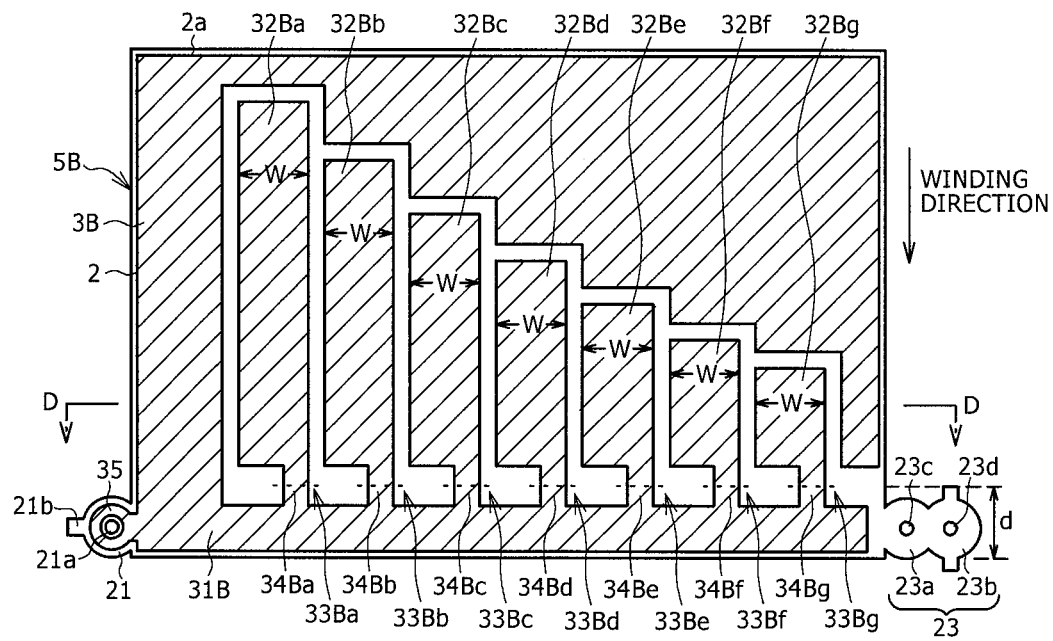
FIGS. 9A to 9C are diagrams for explaining a configuration example of a second embodiment of the capacitor according to this invention.
Figure 9B:
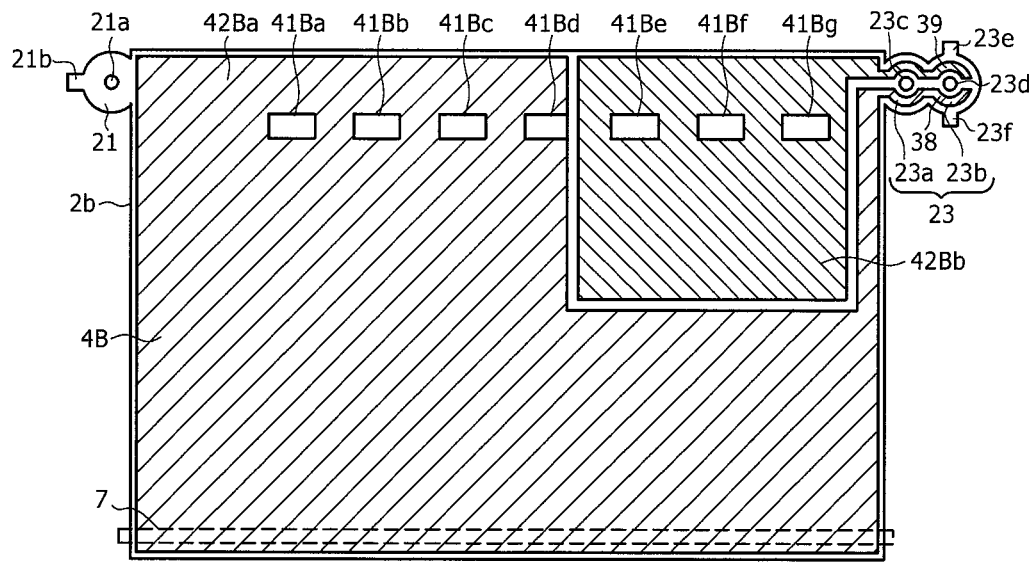
Figure 9C:
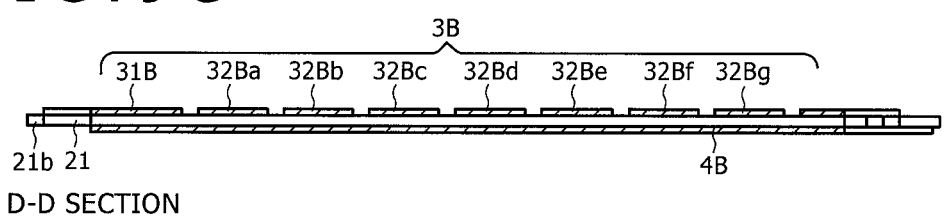
Figure 10A:
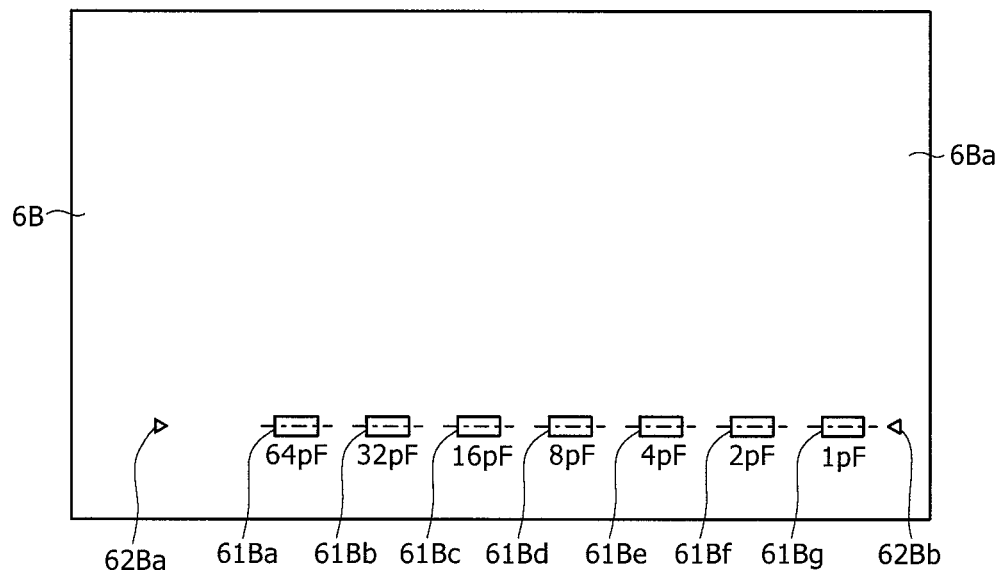
FIGS. 10A to 10C are diagrams for explaining the configuration example of the second embodiment of the capacitor according to this invention.
Figure 10B:
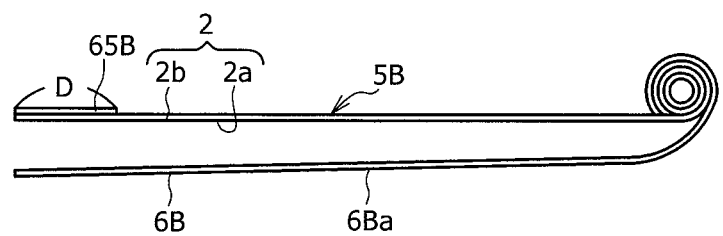
Figure 10C:
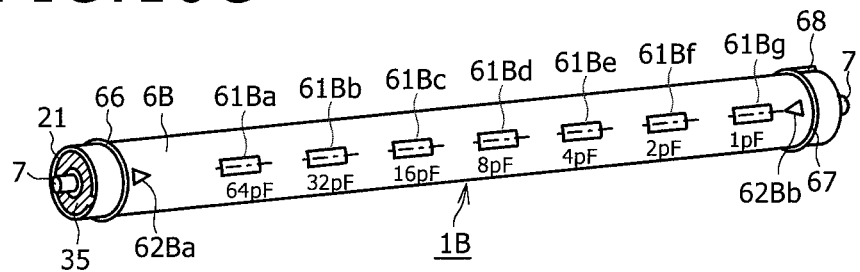

The capacitor 1B is formed by winding a film capacitor 5B, which is obtained by forming a first conductor layer 3B and a second conductor layer 4B disposed opposed to each other with the intermediary of the dielectric film 2 on the front and back surfaces of this dielectric film 2 by, for example, evaporation as shown in FIGS. 9A to 9C, and an insulating film 6B shown in FIGS. 10A to 10C as shown in FIGS. 10B and 10C, so that the capacitor 1B of this second embodiment is configured as a rod-shaped component like that shown in FIG. 10C. The first conductor layer 3B and the second conductor layer 4B are formed of, for example, a metal layer of aluminum, zinc, or an alloy of them and are formed on the dielectric film 2 by metal evaporation.

Similarly to the case of the first embodiment shown in FIGS. 1A and 1B, FIG. 9A shows the side of the front surface 2a of the dielectric film 2 in the case of the capacitor 1B of this second embodiment, on which the first conductor layer 3B is formed. FIG. 9B shows the side of the back surface 2b of the dielectric film 2 in the case of the capacitor 1B of this second embodiment, on which the second conductor layer 4B is formed.

In this second embodiment, as shown in 9A, the conductor pattern of the first conductor layer 3B includes seven capacitance-forming conductor patterns 32Ba, 32Bb, 32Bc, 32Bd, 32Be, 32Bf, and 32Bg having the same configuration as that of the capacitance-forming conductor patterns 32a to 32g of the first embodiment, and area-changeable conductor patterns 33Ba, 33Bb, 33Bc, 33Bd, 33Be, 33Bf, and 33Bg whose number corresponds to the number of capacitance-forming conductor patterns 32Ba to 32Bg. However, this second embodiment is different from the first embodiment in that one common conductor pattern 31B is provided for seven capacitance-forming conductor patterns 32Ba to 32Bg and the area-changeable conductor patterns 33Ba to 33Bg.

The area-changeable conductor patterns 33Ba to 33Bg are formed at positions on the side of the outermost circumferential surface of the wound body of the rod-shaped capacitor 1B so that they can be subjected to physical treatment after the capacitor 1B is made as the completed component, and are formed between the common conductor pattern 31B and the capacitance-forming conductor patterns 32Ba to 32Bg, respectively.

In this second embodiment, the area-changeable conductor patterns 33Ba to 33Bg are configured by circumferentially-disposed conductor patterns 34Ba, 34Bb, 34Bc, 34Bd, 34Be, 34Bf, and 34Bg extended along the circumferential direction of the capacitor 1B formed by being wound into a rod shape. After the capacitor 1B is made as the completed component, these circumferentially-disposed conductor patterns 34Ba to 34Bg are physically divided in the rod-shaped capacitor 1B along the direction perpendicular to the extension direction thereof (i.e., axial core direction of the capacitor 1B) as shown by the dotted line in FIG. 9A. Thereby, the common conductor pattern 31B and the capacitance-forming conductor patterns 32Ba to 32Bg are set to a state of being electrically disconnected from each other. Thus, the conductor area of the first conductor layer 3B forming the capacitance of the capacitor 1B can be changed.

Furthermore, in this example, as shown in FIG. 9A, the circumferentially-disposed conductor patterns 34Ba to 34Bg forming the area-changeable conductor patterns 33Ba to 33Bg are disposed at positions separate from the winding-finish end of the winding direction of the dielectric film 2 by a predetermined distance d in such a manner as to be arranged in one row and at equal intervals along the horizontal direction of the dielectric film 2 (i.e., axial core direction of the capacitor 1B). As a result, in the rod-shaped capacitor 1B, the circumferentially-disposed conductor patterns 34Ba to 34Bg forming the area-changeable conductor patterns 33Ba to 33Bg are disposed at the same position in the circumferential direction of the capacitor 1B in such a manner as to be arranged in one row along the axial core direction of the capacitor 1B. In this case, similarly to the above-described first embodiment, the predetermined distance d is so selected as to satisfy $d < 2\pi r$ when the radius of the rod-shaped capacitor 1B is defined as r so that all of the circumferentially-disposed conductor patterns 34Ba to 34Bg may be located at the outermost circumferential part of the rod-shaped capacitor 1B.

Moreover, also in this example, each of the circumferentially-disposed conductor patterns 34Ba to 34Bg forming the area-changeable conductor patterns 33Ba to 33Bg is so formed that each of the capacitance-forming conductor patterns 32Ba to 32Bg can be individually separated from the common conductor pattern 31B.

In this second embodiment, the second conductor layer 4B on the side of the back surface 2b of the dielectric film 2 is composed of a first back-surface conductor pattern 42Ba provided opposed to four capacitance-forming conductor patterns 32Ba to 32Bd configuring a first group, and a second back-surface conductor pattern 42Bb provided opposed to three capacitance-forming conductor patterns 32Be to 32Bg configuring a second group.

The first back-surface conductor pattern 42Ba and the second back-surface conductor pattern 42Bb are formed on the side of the back surface 2b of the dielectric film 2 in such a manner that they are separated by a region, in which no conductor is formed, so as to form conductor patterns that are not connected to each other.

As shown in FIG. 9B, in the first back-surface conductor pattern 42Ba and the second back-surface conductor pattern 42Bb of the second conductor layer 4B on the side of the back surface 2b of the dielectric film 2, non-conductor regions 41Ba to 41Bg, in which no conductor layer is formed, are set at the positions corresponding to the respective positions of the area-changeable conductor patterns 33Ba to 33Bg of the first conductor layer 3B on the side of the front surface 2a, which are possibly divided (severed) after the completed component is formed, for the reason described for the first embodiment.

In this second embodiment, when the dielectric film 2 and the insulating film 6B are wound and the rod-shaped capacitor 1B is formed as shown in FIG. 10B, for example, an adhesive is applied to the respective end surfaces in the axial core direction of this rod-shaped capacitor 1B to thereby seal the capacitor 1B and ensure quality of the moisture resistance and so forth. In addition, the circular projection 21 and a double circular projection 23 are bent toward the respective end surface sides so that both end parts of the axial core conductor 7 penetrating through the respective penetration holes 21a, 23c, and 23d of the circular projection 21 and the double circular projection 23 may be projected to the external. The circular projection 21 and the double circular projection 23 are bonded to the respective end surfaces by the applied adhesive. Furthermore, adhesive-applied parts 21b, 23e, and 23f formed as extensions of the circular projection 21 and the double circular projection 23 are fixed to the circumferential side surface of the rod-shaped body by, for example, bonding. Due to this, the electrodes of the capacitor are disposed on the circular projection 21 and the double circular projection 23, and the circular projections 21 and 23 function as lid parts for the winding end surfaces of the capacitor 1B. In the circular projection 21, similarly to the first embodiment, the penetration hole 21a, through which the axial core conductor 7 penetrates, and the adhesive-applied part 21b are formed and the conductor electrode 35 extended from the common conductor 31B is formed. On the other hand, the double circular projection 23 of this second embodiment is composed of two circular projections 23a and 23b extended along the axial core direction. On the double circular projection 23, on the side of the back surface 2b of the dielectric film 2, electrode conductors 38 and 39 extended from the first back-surface conductor pattern 42Ba and the second back-surface conductor pattern 42Bb, respectively, are so formed as to be not connected to each other. As shown in FIG. 9B, the electrode conductors 38 and 39 are each formed by connecting two half-ring-shaped conductors on two circular projections 23a and 23b.

Because of being formed on the side of the back surface 2b of the dielectric film 2, the electrode conductors 38 and 39 can be used as an electrode conductor exposed at an end surface in the axial core direction of the rod-shaped capacitor 1B by folding back two circular projections 23a and 23b at the boundary line thereof to make them overlap with each other and preferably fixing them to each other by an adhesive. Specifically, after the dielectric film 2 is wound into a rod shape, first the circular projection 23a is folded back to the side of the winding end surface on which the adhesive is applied. Next, the circular projection 23b is folded back to the opposite side to be overlapped with the circular projection 23a and each other's opposing surfaces are fixed by the adhesive. At this time, the circular projections are folded back to be overlapped with each other in such a manner that the penetration hole 23c of the circular projection 23a and the penetration hole 23d of the circular projection 23b, through each of which the axial core conductor 7 penetrates, are at the same position.

Due to this, at one end surface of the capacitor 1B wound into a rod shape, the electrode conductors 38 and 39 are exposed to the external and the axial core conductor 7 penetrating through the penetration holes 23c and 23d is projected. The adhesive-applied parts 23e and 23f are formed in the double circular projection 23 and are bonded to the circumferential side surface of the rod-shaped capacitor 1B. Thereby, the double circular projection 23 is fixed to the end surface of the capacitor 1B.

Furthermore, in this second embodiment, as shown in FIGS. 10A to 10C, on the winding-finish end side of the insulating film 6B wound together with the film capacitor 5B, which is the side of a surface 6Ba exposed to the external after the winding finish, division marks 61Ba to 61Bg are formed by, for example, printing and are displayed at the positions that correspond to the respective positions of the circumferentially-disposed conductor patterns 34Ba to 34Bg configuring the area-changeable conductor patterns 33Ba to 33Bg formed in the first conductor layer 3B on the dielectric film 2 when the insulating film 6B is overlapped on the dielectric film 2 and wound. Near the respective division marks 61Ba to 61Bg, capacitance values according to the respective areas of the capacitance-forming conductor patterns 32Ba to 32Bg, which are electrically disconnected and separated when the circumferentially-disposed conductor patterns 34Ba to 34Bg configuring the area-changeable conductor patterns 33Ba to 33Bg, respectively, are divided, are marked by printing, for example.

Furthermore, circumferential position marks 62Ba and 62Bb are formed by printing, for example, and are displayed in order to indicate the circumferential position of the circumferentially-disposed conductor patterns 34Ba to 34Bg configuring the area-changeable conductor patterns 33Ba to 33Bg. The division marks 61Ba to 61Bg and the capacitance values are disposed and displayed in one row at equal intervals along the axial core direction of the rod-shaped capacitor 1B as shown in FIGS. 10A and 10C.

As shown in FIG. 10B, also in this example, near the winding-finish end of the surface 2b of the dielectric film 2 configuring the film capacitor 5B, a division block sheet 65B is formed by deposition in a partial region having a length D, equal to or larger than the length corresponding to the whole circumference of the capacitor 1B, from this winding-finish end. The division of the circumferentially-disposed conductor patterns 34Ba to 34Bg configuring the area-changeable conductor patterns 33Ba to 33Bg is performed from the side of the surface 6Ba of the insulating film 6B in FIGS. 10A to 10C. In order to block the wound part located under the circumferentially-disposed conductor patterns 34Ba to 34Bg from being divided by this division, the division block sheet 65B having the predetermined length D is formed by deposition near the winding-finish end of the surface 2b of the dielectric film 2 configuring the film capacitor 5B corresponding to the positions at which the circumferentially-disposed conductor patterns are disposed.

Equivalent Circuit of Capacitor 1B

Figure 11:
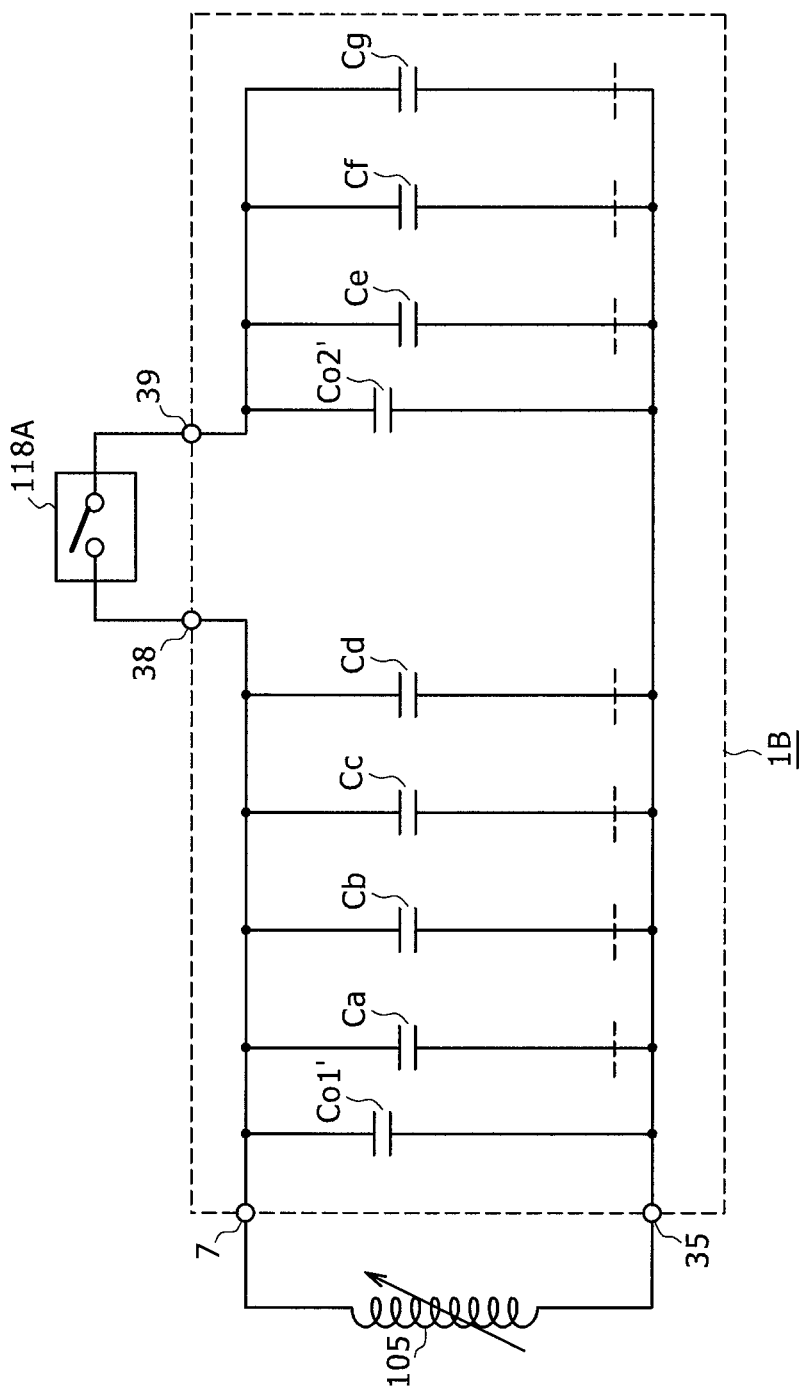
FIG. 11 is a diagram showing an equivalent circuit example of the second embodiment of the capacitor according to this invention.

The equivalent circuit of the capacitor 1B of the second embodiment with the above-described configuration is shown in FIG. 11 and is surrounded by the dotted line. In this FIG. 11, Co1' and Co2' are capacitances that are formed by opposing of the common conductor pattern 31B of the first conductor layer 3B to the first back-surface conductor pattern 42Ba and the second back-surface conductor pattern 42Bb of the second conductor layer 4B, with the intermediary of the dielectric film 2, and that are according to the respective areas of the first back-surface conductor pattern 42Ba and the second back-surface conductor pattern 42Bb.

Ca to Cd are capacitances that are formed by opposing of the capacitance-forming conductor patterns 32Ba to 32Bd of the first conductor layer 3B, respectively, to the first back-surface conductor pattern 42Ba of the second conductor layer 4B, with the intermediary of the dielectric film 2, and that are according to their respective areas. Ce to Cg are capacitances that are formed by opposing of the capacitance-forming conductor patterns 32Be to 32Bg of the first conductor layer 3B, respectively, to the second back-surface conductor pattern 42Bb of the second conductor layer 4B, with the intermediary of the dielectric film 2, and that are according to their respective areas.

In this second embodiment, the axial core conductor 7 is connected to only the first back-surface conductor pattern 42Ba of the second conductor layer 4B on the side of the back surface 2b of the dielectric film 2. Furthermore, the axial core conductor 7 is connected to the electrode conductor 38 via the first back-surface conductor pattern 42Ba.

On the other hand, in this second embodiment, the electrode conductor 35 is connected to the common conductor pattern 31B, to which all of the capacitance-forming conductor patterns 32Ba to 32Bg are connected via the circumferentially-disposed conductor patterns 34Ba to 34Bg configuring the area-changeable conductor patterns 33Ba to 33Bg. The second back-surface conductor pattern 42Bb opposed to the capacitance-forming conductor patterns 32Be to 32Bg configuring the capacitance of the second group is connected to the electrode conductor 39.

Therefore, as shown in FIG. 11, the capacitance Co1' according to the opposing area between the common conductor pattern 31B and the first back-surface conductor pattern 42Ba and the capacitances Ca to Cd according to the areas of the capacitance-forming conductor patterns 32Ba to 32Bd are connected in parallel to each other between the axial core conductor 7, connected to the first back-surface conductor pattern 42Ba of the second conductor layer 4B, and the ring-shaped electrode conductor 35.

When any of the circumferentially-disposed conductor patterns 34Ba to 34Bd configuring the area-changeable conductor patterns 33Ba to 33Rd is divided as described above, this divided capacitance among the capacitances Ca to Cd connected in parallel to the capacitor Co1' is cut at the position indicated by the dotted line in FIG. 11 to become disconnected. Thus, the capacitance between the axial core conductor 7 and the ring-shaped electrode conductor 35, as the respective electrodes of the capacitor, decreases by this disconnected capacitance.

When the electrode conductor 38 is electrically connected to the electrode conductor 39 by the push switch 118A, for example, the first back-surface conductor pattern 42Ba and the second back-surface conductor pattern 42Bb of the second conductor layer 4B are connected to the axial core conductor 7. This provides the state in which the capacitance Co1', the capacitance Co2' according to the opposing area between the second back-surface conductor pattern 42Bb and the common conductor pattern 31B, and the capacitances Ca to Cg according to the areas of the capacitance-forming conductor patterns 32Ba to 32Bg are connected in parallel to each other between the axial core conductor 7 and the ring-shaped electrode conductor 35.

When any of the circumferentially-disposed conductor patterns 34Be to 34Bg configuring the area-changeable conductor patterns 33Be to 33Bg is divided, this divided capacitance among the capacitances Ce to Cg connected in parallel to the capacitor Co2' is cut at the position indicated by the dotted line in FIG. 11 to become disconnected. Thus, the capacitance of the capacitor 1B decreases by this disconnected capacitance.

Therefore, also when the capacitor 1B of this second embodiment is used, the capacitance value can be adjusted exactly as with the capacitor 1 of the first embodiment. If the capacitor 1B is used as a capacitor for resonant frequency adjustment of the resonant circuit in the position indicator, it is possible to provide, with one capacitor 1B, operation and effects equivalent to those provided by a large number of capacitors including the existing trimmer capacitor as described above.

Other Examples of Position Indicator Including Capacitor 1 or Capacitor 1B

First Example

The position indicator 100A, to which the capacitor 1 of the above-described first embodiment is applied, detects frequency change (phase) based on change in the inductance value of the coil 105 in association with the writing pressure applied to the core body 101 to thereby detect the writing pressure.

A position indicator 100B to be described below detects the writing pressure based on change in the capacitance of a capacitor configuring a resonant circuit together with the coil 105.

Figure 12:
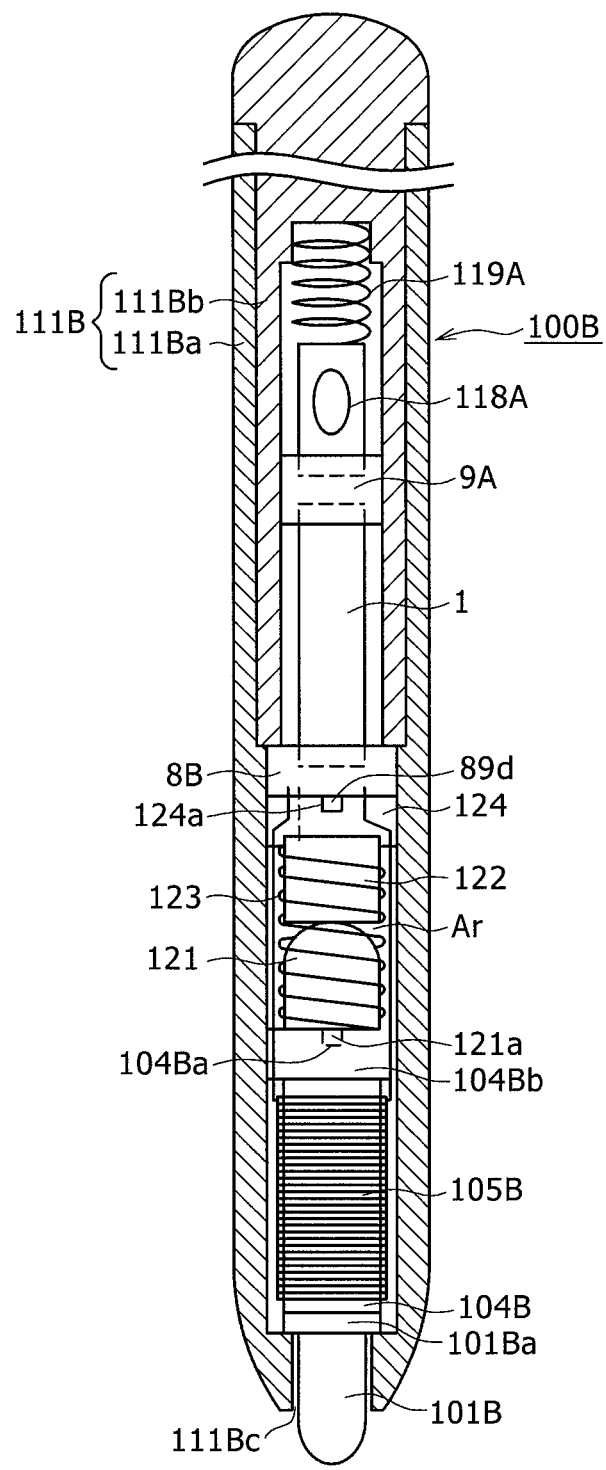
FIG. 12 is a diagram showing another application example of the embodiments of the capacitor according to this invention.

FIG. 12 shows a configuration example of the position indicator 100B of this example. In this FIG. 12, the same part as that in the position indicator 100A shown in FIG. 6 is given the same reference numeral and detailed description thereof is omitted. Also in this FIG. 12, a case 111B is shown in cross-section for easy explanation of the configuration within the case 111B.

Also in the position indicator 100B of this example, the case 111B is composed of a hollow cylindrical outside case 111Ba and an inside case 111Bb and has a configuration in which the outside case 111Ba is concentrically fitted to the inside case 111Bb, similarly to the position indicator 100A. In the hollow part of the case 111B, the following components are so housed as to be sequentially arranged along the center axis direction of the case 111B as shown in FIG. 12: a core body 101B, a coil 105B that is as one example of an inductance element and is wound around a ferrite core 104B as one example of a magnetic body, components 121, 122, 123, and 124 configuring a variable-capacitance capacitor to be described later for responding to the writing pressure, the capacitor 1 of the first embodiment, and the push switch 118A.

In this example, the above-mentioned variable-capacitance capacitor for responding to the writing pressure in the position indicator 100B is configured with mechanism components such as the elastic electrical conductor 121, the dielectric 122, the coil spring 123 having electrical conductivity, and the electrical conductor 124 formed of a material like, for example, electrically-conductive rubber in order to detect the writing pressure applied to the core body 101B as change in the capacitance.

The core body 101B is housed in the case 111B together with the ferrite core 104B in such a manner that it abuts against the ferrite core 104B and its tip projects as the pen tip from an opening 111Bc of the outside case 111Ba. The core body 101B has a flange part 101Ba. This flange part 101Ba is engaged with a step part provided around the opening 111Bc of the outside case 111Ba so that the core body 101B may be locked in the case 111B.

The coil 105B is wound around the ferrite core 104B. As shown in FIG. 12, a concave hole 104Ba is provided in the end surface of a flange part 104Bb of the ferrite core 104B. The elastic electrical conductor 121 is formed of a material like, for example, electrically-conductive rubber. It has electrical conductivity and elasticity and has a projection 121a fitted into the concave hole 104Ba. The elastic electrical conductor 121 is mounted on the end surface of the flange part 104Bb of the ferrite core 104B by fitting its projection 121a into the concave hole 104Ba. The diameter of this elastic electrical conductor 121 is set equal to that of the dielectric 122. By biasing the elastic electrical conductor 121 toward the core body 101B by the coil spring 123 having electrical conductivity, the elastic electrical conductor 121 and the dielectric 122 are disposed opposed to each other in such a manner that an air gap Ar is formed between the elastic electrical conductor 121 and the dielectric 122 when the writing pressure is not applied to the core body 101B. In this case, the winding diameter (inner diameter) of the coil spring 123 is set slightly larger than that of the elastic electrical conductor 121 and the dielectric 122. One axial end side of the coil spring 123 is locked near the bottom of the elastic electrical conductor 121 with the elastic electrical conductor 121 and the dielectric 122 housed in the coil frame of the coil spring 123, and the coil spring 123 is electrically connected to the elastic electrical conductor 121. The other end side of the coil spring 123 is electrically insulated from the electrical conductor 124 and connected at a coupling member 8B as described later.

As shown in FIG. 12, the end surface of the coupling member 8B on the side opposite to the end surface opposed to the electrical conductor 124 is so configured as to abut against the end surface of the inside case 111Bb. This restricts the position of the coupling member 8B in the direction opposite to the direction of the core body 101B. Therefore, the ferrite core 104B is always elastically biased toward the core body 101B by the coil spring 123. A recess 124a for positioning is formed in the end surface of the electrical conductor 124 on the side opposite to the end surface, against which the dielectric 122 abuts.

The coupling member 8B is disposed in the outside case 111Ba in such a manner as to abut against the end surface of the electrical conductor 124 on the side opposite to the end surface, against which the dielectric 122 abuts. As shown in FIG. 12 and FIGS. 13A to 13D to be described later, in this coupling member 8B, a projection 89d for positioning and electrical connection to the electrical conductor 124 is formed at such a position as to be fitted into the recess 124a formed in the electrical conductor 124. The projection 89d formed in the coupling member 8B is fixed by, for example, an adhesive in such a state as to be fitted into the recess 124a of the electrical conductor 124.

To the side of this coupling member 8B on the side opposite to the end surface, against which the electrical conductor 124 abuts, the axial end part of the capacitor 1 at which the electrode conductor 35 is formed is fitted. The axial end part of the capacitor 1 on the opposite side is coupled to the push switch 118A via the coupling member 9A similarly to the example of FIG. 6. Also in this example, the coil spring 119A is disposed in the inside case 111Bb to always elastically bias the push switch 118A and the capacitor 1 toward the core body 101B. This ensures electrical contact among the respective mechanism components and prevents the backlash of the respective mechanism components configuring the position indicator 100B.

In the case of this example, as described later, the other end side of the coil spring 123 and the electrical conductor 124 are connected to one end and the other end of the coil 105B by the coupling member 8B. Thereby, the coil 105B is electrically connected in parallel to the variable-capacitance capacitor that is formed of the elastic electrical conductor 121, the dielectric 122, the coil spring 123, and the electrical conductor 124 so as to respond to the writing pressure.

In this example, when pressing force (writing pressure) is applied from the side of the core body 101B configuring the pen tip to the elastic electrical conductor 121 via the ferrite core 104B, the end surface of the elastic electrical conductor 121 made to bulge into a dome shape is so biased as to get closer to and contact the end surface of the dielectric 122 against the biasing force of the coil spring 123. The dome-shaped bulging end surface of the elastic electrical conductor 121 is brought into contact with the end surface of the dielectric 122 with the contact area depending on the pressing force. As a result, the capacitance of the variable-capacitance capacitor configured between the elastic electrical conductor 121 and the electrical conductor 124 with the intermediary of the dielectric 122 changes in association with the writing pressure.

In this embodiment, because this variable-capacitance capacitor is connected in parallel to the coil 105B to form a resonant circuit, the resonant frequency of the resonant circuit changes in association with capacitance change depending on the writing pressure. Thus, the phase (resonant frequency) of radio waves transmitted from the coil 105 of the resonant circuit changes. Therefore, also in the case of the position indicator 100B of this example, detection of the position and the writing pressure is possible in the position detecting device having the circuit configuration shown in FIG. 25.

The coupling member 9A in the position indicator 100B of this example has the above-described configuration of FIGS. 8A to 8E. Therefore, description thereof is omitted and a configuration example of only the coupling member 8B will be described.

FIGS. 13A to 13D show a configuration example of the coupling member 8B. This coupling member 8B has almost the same configuration as that of the coupling member 8A shown in FIGS. 7A to 7C. The same constituent part as that in the coupling member 8A is given the same reference numeral and detailed description thereof is omitted.

Figure 13A:
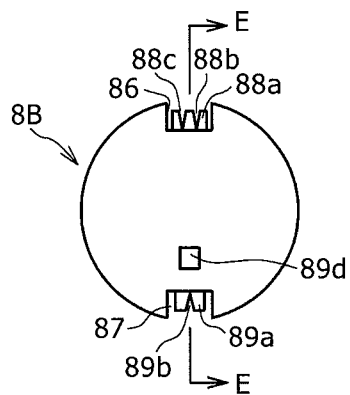
FIGS. 13A to 13D are diagrams for explaining another application example of the embodiments of the capacitor according to this invention.
Figure 13B:
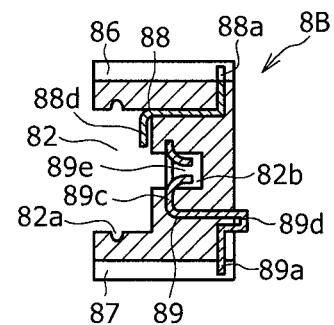
Figure 13C:
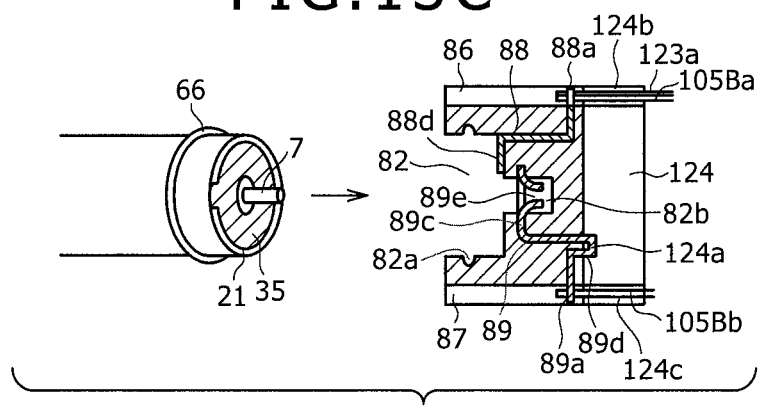
Figure 13D:
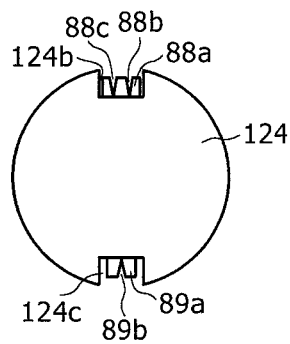

FIG. 13A is a diagram when the coupling member 8B is viewed from the side coupled to the electrical conductor 124. FIG. 13B is a sectional view along line E-E in FIG. 13A. FIG. 13C is a diagram for explaining how the capacitor 1 is coupled to the coupling member 8B coupled to the electrical conductor 124.

As shown in FIGS. 13A and 13B, the coupling member 8B is formed of a columnar resin member and is obtained by performing insert molding in such a manner that a recess 82 is formed, into which the capacitor 1 is fitted, and terminal members 88 and 89 having elasticity are inserted. The terminal members 88 and 89 are for electrically connecting one end 105Ba and the other end 105Bb of the coil 105B, the coil spring 123 connected to the elastic electrical conductor 121 to serve as one electrode of the variable-capacitance capacitor and the electrical conductor 124 serving as the other electrode, and the electrode conductor 35 and the axial core conductor 7 of the capacitor 1.

In the coupling member 8B of this example, one end parts 88a and 89a of the terminal members 88 and 89 are each vertically disposed along the direction perpendicular to the circumferential direction in concave trenches 86 and 87 formed at positions separate from each other by an angular distance of 180 degrees in the circumferential side surface of the columnar resin member. Furthermore, as shown in FIG. 13A, two V-shaped notches 88b and 88c are formed in this vertically-disposed one end part 88a of the terminal member 88. In addition, one V-shaped notch 89b is formed in vertically-disposed one end part 89a of the terminal member 89.

To one of two V-shaped notches 88b and 88c, one end 105Ba of the coil 105B is locked and electrically connected. To the other of two V-shaped notches 88b and 88c, an end part 123a of the coil spring 123 electrically connected to the elastic electrical conductor 121 is locked and electrically connected. The other end 105Bb of the coil 105B is locked and electrically connected to the V-shaped notch 89b formed in one end part 89a of the terminal member 89 vertically disposed in the concave trench 87.

The terminal member 89 is inserted in the columnar resin member in insert molding in such a manner as to form a projection 89d that projects from the flat surface abutting against the electrical conductor 124. This projection 89d is fitted into the recess 124a of the electrical conductor 124 and thereby the terminal member 89 is electrically connected to the electrical conductor 124. The coupling member 8B is fixed to the electrical conductor 124 by bonding or the like.

In the coupling member 8B, the other end part 88d of the terminal member 88 is so configured as to be exposed from the bottom of the recess 82. Due to this, as shown in FIG. 13C, the electrode conductor 35 of the capacitor 1 is elastically brought into contact with and electrically connected to the end part 88d of the terminal member 88 when the rod-shaped capacitor 1 is inserted into the recess 82.

The other end part 89c of the terminal member 89 is located in a concave hole 82b formed at the center of the bottom of the recess 82 similarly to the terminal member 84 of the coupling member 8A shown in FIGS. 7A to 7C. At the part at which the other end part 89c of the terminal member 89 is located in this concave hole 82b, an insertion hole 89e with a bent part of an electrically-conductive metal having elasticity is formed and the axial core conductor 7 of the capacitor 1 can be inserted thereto.

Therefore, when the capacitor 1 is inserted in the recess 82, the axial core conductor 7 of the capacitor 1 is inserted into the insertion hole 89e to contact with the bent part of an electrically-conductive metal having elasticity. This electrically connects the axial core conductor 7 to the terminal member 89. The electrode conductor 35 of the capacitor 1 is electrically connected to the other end part 88d of the terminal member 88. Furthermore, the ring-shaped projection 66 of the capacitor 1 is fitted to a ring-shaped concave trench 82a of the recess 82 of the coupling member 8B. Thereby, the capacitor 1 is locked to the coupling member 8B.

In this manner, via the coupling member 8B, the variable-capacitance capacitor having the coil spring 123 connected to the elastic electrical conductor 121 and the electrical conductor 124 as its electrodes, the coil 105 wound around the ferrite core 104, and the capacitor 1 are engaged with each other to be electrically connected to each other.

Figure 14:
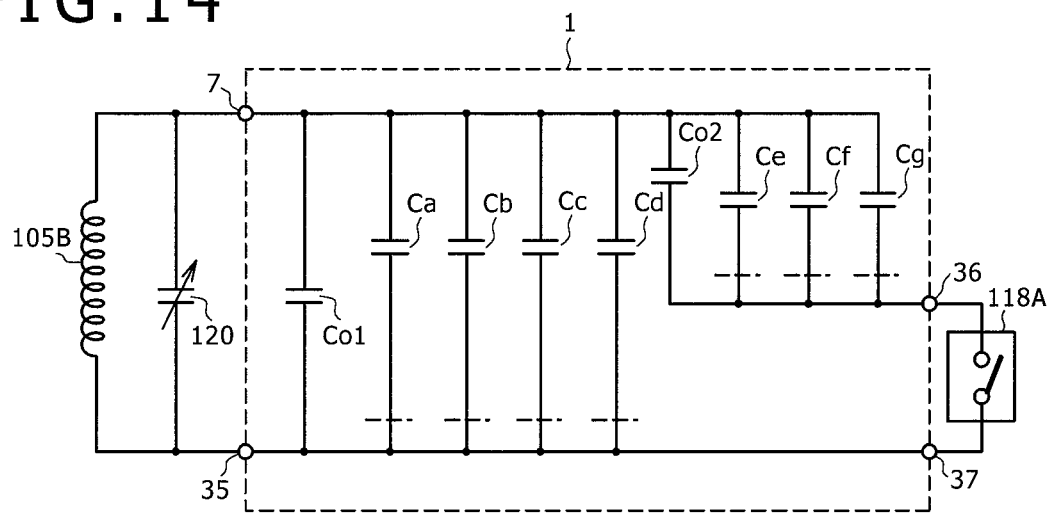
FIG. 14 is a diagram showing an equivalent circuit example of another application example of the embodiments of the capacitor according to this invention.

The equivalent circuit of this case is as shown in FIG. 14. Specifically, a variable-capacitance capacitor 120 composed of the elastic electrical conductor 121, the dielectric 122, the coil spring 123, and the electrical conductor 124 is connected in parallel to the coil 105B. Furthermore, a circuit configuration is obtained in which the capacitances Co1, Co2, and Ca to Cg of the capacitor 1 are connected in parallel to this parallel circuit of the coil 105B and the variable-capacitance capacitor 120.

Therefore, also in the position indicator 100B of this example, the resonant frequency of the resonant circuit can be optimized by performing division treatment of the desired pattern among the axially-disposed conductor patterns 34a to 34g configuring the area-changeable conductor patterns 33a to 33g of the capacitor 1.

Although the capacitor 1 of the first embodiment is employed as the capacitor configuring the resonant circuit with the coil 105B in the above-described example of FIG. 12, it is obvious that the capacitor 1B of the second embodiment can be similarly used.

Second Example

Next, yet another example of the position indicator including the capacitor 1 or the capacitor 1B will be described. A position indicator 100C of a second example to be described below also detects the writing pressure as change in the capacitance of a capacitor configuring a resonant circuit together with a coil 105C similarly to the position indicator 100B of the above-described first example. However, the position indicator 100C of this second example does not detect the writing pressure by using a variable-capacitance capacitor obtained by a combination of plural mechanism components like that in the above-described first example, but has the configuration that has been previously proposed by the present assignee as Japanese Patent Application No. 2012-15254 (U.S. application Ser. No. 13/728,699) and uses a semiconductor device referred to as a so-called MEMS (Micro Electromechanical System). In the position indicator 100C of this second example, the variable-capacitance capacitor that responds to the writing pressure is formed of a single capacitive pressure sensing semiconductor device (hereinafter referred to as the pressure sensing device).

Figure 15:
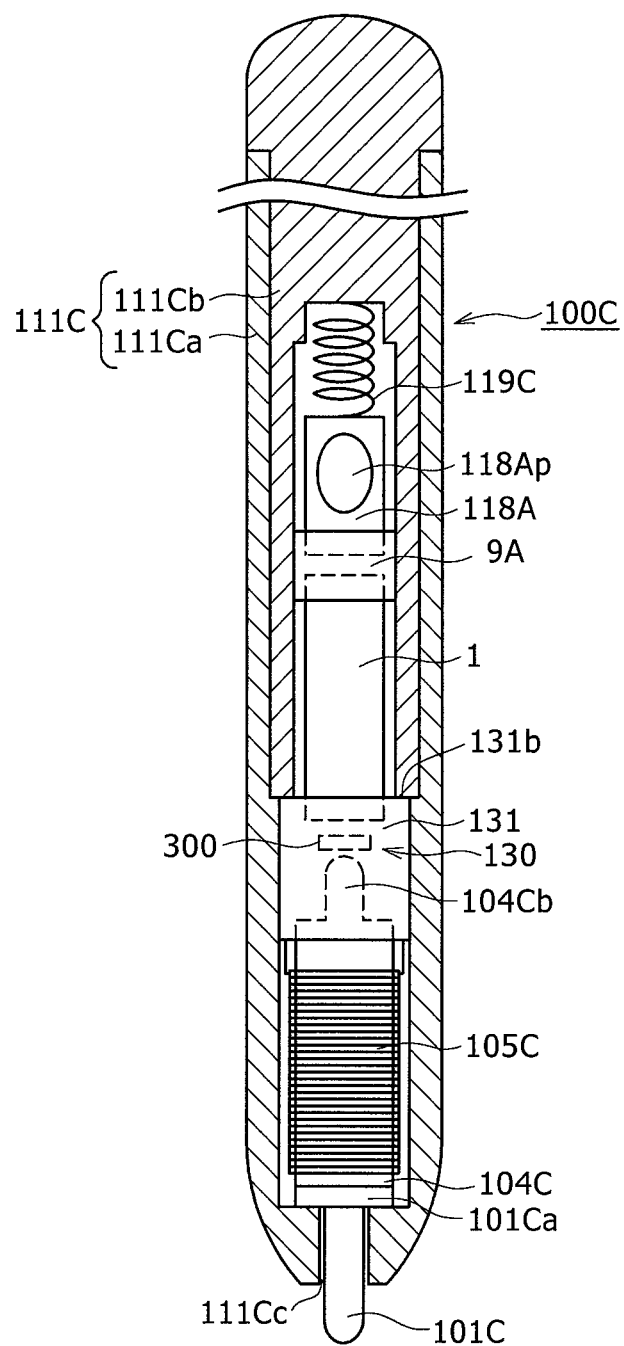
FIG. 15 is a diagram showing yet another application example of the embodiments of the capacitor according to this invention.
Figure 17A:
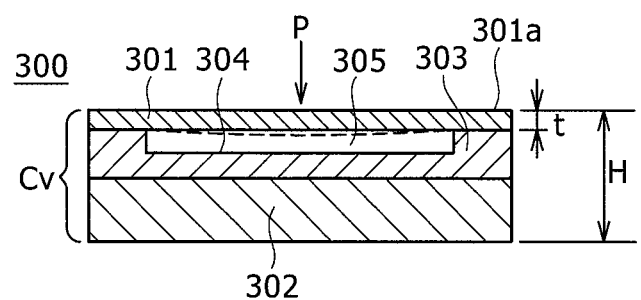
FIGS. 17A to 17C are diagrams for explaining yet another application example of the embodiments of the capacitor according to this invention.
Figure 17B:
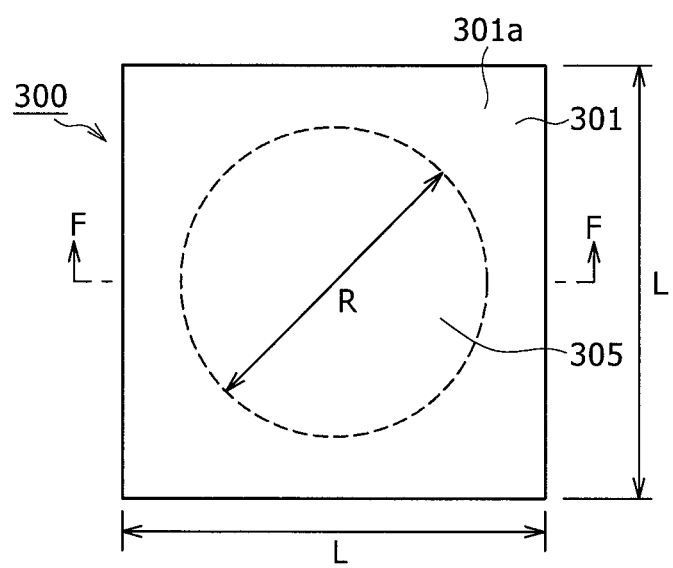
Figure 17C:
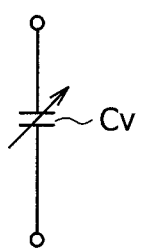

FIGS. 15 to 17C are diagrams for explaining a configuration example of the position indicator 100C of this second example. FIG. 15 is a diagram showing a configuration example of the position indicator 100C of this example as a whole, and a case 111C is shown in cross-section for easy explanation of the configuration within the case 111C. FIG. 16 is a diagram showing part of mechanism components housed inside the case 111C. FIGS. 17A to 17C are diagrams for explaining the configuration of the pressure sensing device used in this example.

Also in the position indicator 100C of this example, the case 111C is composed of a hollow cylindrical outside case 111Ca and an inside case 111Cb and has a configuration in which the outside case 111Ca is concentrically fitted to the inside case 111Cb, similarly to the position indicators 100A and 100B. In the hollow part of the case 111C, the following components are so housed as to be sequentially arranged along the center line direction of the case 111C as shown in FIG. 15: a core body 101C, a coil 105C that is one example of an inductance element and is wound around a ferrite core 104C as one example of a magnetic body, a pressure sensing device 130 for writing pressure detection, the capacitor 1 of the first embodiment, and the push switch 118A. The respective housed components are always elastically biased toward the core body 101C by a coil spring 119C.

In this example, the core body 101C is housed in the case 111C together with the ferrite core 104C in such a manner that it abuts against the ferrite core 104C and its tip projects as the pen tip from an opening 111Cc of the outside case 111Ca. The core body 101C has a flange part 101Ca. This flange part 101Ca is engaged with a step part provided around the opening 111Cc of the outside case 111Ca so that the core body 101C may be locked in the case 111C.

In this example, as shown in FIGS. 16A and 16B, a unit configuration is made in which the ferrite core 104C, against which the core body 101C is made to abut and around which the coil 105C is wound, is held by a package 131 of the pressure sensing device 130 to provide a monolithic structure.

FIG. 16A is a longitudinal sectional view of the unitized part composed of the core body 101C, the ferrite core 104C, around which the coil 105C is wound, and the pressure sensing device 130. FIG. 16B is a perspective view for explaining the coupling part between the package 131 of the pressure sensing device 130 and the ferrite core 104C, around which the coil 105C is wound.

As shown in FIG. 16A, a recess 104Ca, into which a projection 101Cb formed at the center of the flange part 101Ca of the core body 101C is fitted, is formed in the end surface of the ferrite core 104C on the side of the core body 101C. The projection 101Cb of the core body 101C is press-fitted into the recess 104Ca of the ferrite core 104C and they are fixed to each other by an adhesive, for example.

As shown in FIGS. 15 and 16A, the ferrite core 104C has a solid columnar shape in this example and the coil 105C is wound around it. Along the center line direction of the ferrite core 104C, a small-diameter part 104Cb having a small diameter is formed on the side opposite to the core body 101C across the wound part of the coil 105C. In this example, the diameter of the wound part of the coil 105C around the ferrite core 104C is set to 3 mm, for example, and the diameter of the small-diameter part 104Cb is set to 1 mm, for example.

The small-diameter part 104Cb of the ferrite core 104C is inserted in the pressure sensing device 130 as a pressing member that transmits the pressure depending on the writing pressure to the pressure sensing device 130. Furthermore, in this example, part of the large-diameter part of the ferrite core 104C around which the coil 105C is wound is also held in the package 131 of the pressure sensing device 130 as shown in FIGS. 16A and 16B.

Configuration Example of Pressure Sensing Device 130

Next, the configuration of the pressure sensing device 130 of this example will be described.

In the pressure sensing device 130 of this example, a pressure detecting chip 300 configured as, for example, a semiconductor element fabricated by a MEMS technique is sealed in the package 131 having, for example, a cubic or rectangular parallelepiped box shape. Furthermore, in this example, the package 131 of the pressure sensing device 130 is so configured as to have a function as a member to mechanistically and electrically couple the ferrite core 104C, around which the coil 105C is wound, to the capacitor 1 of the first embodiment.

The pressure detecting chip 300 detects applied pressure as change in the capacitance and has a configuration shown in FIGS. 17A to 17C in this example. FIG. 17B is a diagram when the pressure detecting chip 300 of this example is viewed from the side of a surface 301a that receives a pressure P (see FIG. 17A). FIG. 17A is a sectional view along line F-F in FIG. 17B.

As shown in FIG. 17, the pressure detecting chip 300 of this example has a rectangular parallelepiped shape of depth×width×height=L×L×H. In this example, L=1.5 mm and H=0.5 mm.

The pressure detecting chip 300 of this example is composed of a first electrode 301, a second electrode 302, and an insulating layer (dielectric layer) 303 between the first electrode 301 and the second electrode 302. The first electrode 301 and the second electrode 302 are formed of a conductor composed of single-crystal silicon (Si) in this example. The insulating layer 303 is formed of an insulating film composed of an oxide film ($SiO_2$) in this example. The insulating layer 303 does not need to be formed of an oxide film and may be formed of another insulating object.

On the side of the surface of this insulating layer 303 opposed to the first electrode 301, a circular recess 304 centered at the center position of this surface is formed in this example. By this recess 304, a space 305 is formed between the insulating layer 303 and the first electrode 301. In this example, the bottom surface of the recess 304 is a flat surface and the diameter R thereof is set to, for example, R=1 mm. Furthermore, the depth of the recess 304 is set to several tens of microns to several hundreds of microns in this example.

The pressure detecting chip 300 of this example is fabricated by a semiconductor process in the following manner. First, the insulating layer 303 formed of an oxide film is formed on single-crystal silicon configuring the second electrode 302. Next, the recess 304 is formed by disposing a mask covering the part other than the circular part with the diameter R and performing etching so that the space 305 may be formed in this insulating layer 303 of the oxide film. Then, single-crystal silicon configuring the first electrode 301 is deposited on the insulating layer 303. Thereby, the pressure detecting chip 300 having the space 305 below the first electrode 301 is formed.

The existence of this space 305 allows the first electrode 301 to be so displaced as to bend toward the space 305 when being pressed from the side of the surface 301a on the side opposite to the surface opposed to the second electrode 302. The thickness t of the single-crystal silicon as an example of the first electrode 301 is set to such a thickness as to allow bending by the applied pressure P and is set smaller than the thickness of the second electrode 302. As described hereunder, this thickness t of the first electrode 301 is selected so that the bending displacement characteristic of the first electrode 301 against the applied pressure P will be a desired one.

The pressure detecting chip 300 having the above-described configuration is a capacitor in which capacitance Cv is formed between the first electrode 301 and the second electrode 302. When the pressure P is applied to the first electrode 301 from the side of the surface 301a of the first electrode 301 on the side opposite to the surface opposed to the second electrode 302 as shown in FIG. 17A, the first electrode 301 bends as shown by the dotted line in FIG. 17A and the distance between the first electrode 301 and the second electrode 302 is shortened. Thus, the value of the capacitance Cv changes to become larger. The amount of bending of the first electrode 301 changes depending on the magnitude of the applied pressure P. Therefore, the capacitance Cv changes depending on the magnitude of the pressure P applied to the pressure detecting chip 300 as shown in an equivalent circuit of FIG. 17C.

It is confirmed that bending by several microns is caused by pressure in the single-crystal silicon shown as an example of the first electrode 301 and the capacitance Cv of the capacitor shows a change of 0 to 100 pF (picofarad) depending on the pressing force P of the writing pressure in association with this bending.

In the pressure sensing device 130 of this embodiment, the pressure detecting chip 300 having the above-described configuration is housed in the package 131 in the state in which the surface 301a of the first electrode 301, which receives pressure, is opposed to a top surface 131a of the package 131 in FIGS. 15, 16A, and 16B.

In this example, the package 131 is composed of a package member 132 formed of an electrical insulating material such as a ceramic material and a resin material and an elastic member 133 provided on the side of the surface 301a, across which the pressure detecting chip 300 receives pressure, in this package member 132. The elastic member 133 is one example of a pressure transmitting member having predetermined elasticity.

Furthermore, in this example, a recess 132a corresponding to the area of the first electrode 301 is made at part above the surface 301a of the first electrode 301, across which the pressure detecting chip 300 receives pressure, in the package member 132, and the elastic member 133 is so disposed as to be packed in this recess 132a. The elastic member 133 is formed of a silicone resin in this example.

In the package 131, a communication hole 134 that communicates from the top surface 131a to part of the elastic member 133 is formed. Specifically, a penetration hole 132b configuring part of the communication hole 134 is formed in the package member 132 and a concave hole 133a configuring the end part of the communication hole 134 is made in the elastic member 133. Furthermore, a taper part 132c is formed on the side of the opening part of the communication hole 134 of the package member 132 (on the side of the top surface 131a) and the opening part of the communication hole 134 is formed in a trumpet shape.

As shown in FIGS. 15, 16A, and 16B, the small-diameter part 104Cb of the ferrite core 104C is inserted in the communication hole 134 for the pressure sensing device 130. In this case, the pressure P depending on the writing pressure applied to the core body 101C serving as the pen tip part is transmitted to the pressure detecting chip 300 of the pressure sensing device 130 along the axial core direction (center line direction) of the ferrite core 104C. In this example, the inner diameter of the penetration hole 132b of the package member 132 is set slightly larger than the diameter of the part of the small-diameter part 104Cb of the ferrite core 104C abutting against the penetration hole 132b. In addition, the inner diameter of the concave hole 133a of the elastic member 133 is set slightly smaller than the diameter of the part of the small-diameter part 104Cb of the ferrite core 104C abutting against the concave hole 133a. This provides a configuration in which guiding of the small-diameter part 104Cb of the ferrite core 104C to the inside of the pressure sensing device 130 is facilitated by the taper part 132c and the penetration hole 132b and the ferrite core 104C, whose small-diameter part 104Cb is inserted in the pressure sensing device 130, is so held as not to easily drop off.

Specifically, because the opening part of the communication hole 134 has a trumpet shape, the small-diameter part 104Cb of the ferrite core 104C is guided by the taper part 132c at this opening part to be easily led and inserted into the communication hole 134. Furthermore, the small-diameter part 104Cb of the ferrite core 104C is pushed to the inside of the concave hole 133a of the elastic member 133 at the end part of the communication hole 134. In this manner, the small-diameter part 104Cb of the ferrite core 104C is inserted into the communication hole 134 of the pressure sensing device 130 to thereby be positioned in such a state as to apply the pressure P along the axial core direction to the side of the surface across which the pressure detecting chip 300 receives pressure.

In this case, because the inner diameter of the concave hole 133a is slightly smaller than the diameter of the part of the small-diameter part 104Cb of the ferrite core 104C abutting against the concave hole 133a, the small-diameter part 104Cb of the ferrite core 104C becomes such a state as to be elastically held by the elastic member 133 in the concave hole 133a of the elastic member 133. That is, when being inserted in the communication hole 134 of the pressure sensing device 130, the small-diameter part 104Cb of the ferrite core 104C is held by the pressure sensing device 130.

In this example, the package 131 of the pressure sensing device 130 has, on the side of the top surface 131a, a recess 131c for fitting and holding of part of the coil-wound part of the ferrite core 104C. The package 131 holds the ferrite core 104C in the state in which the small-diameter part 104Cb of the ferrite core 104C is inserted in the communication hole 134 of the package 131 and part of the coil-wound part of the ferrite core 104C is fitted to the recess 131c.

In this case, a cushion member 135 is provided between the step part, which is made by the coil-wound part and the small-diameter part 104Cb of the ferrite core 104C, and the bottom of the recess 131c of the package 131 of the pressure sensing device 130, in order to prevent limiting of bending of the first electrode 301 of the pressure detecting chip 300 toward the space 305 by the small-diameter part 104Cb of the ferrite core 104C based on applied pressure. It is also possible that the package member 132 configuring the package 131 is formed by the same material as that of the elastic member 133, specifically, for example, a silicone resin.

Furthermore, as shown in FIG. 15, the core body 101C, the ferrite core 104C, and the pressure sensing device 130 are housed in the case 111C in such a manner that an end surface 131b of the pressure sensing device 130 on the opposite side to the side coupled to the ferrite core 104C is locked by the end surface of the inside case 111Cb so that the pressure sensing device 130 may be prevented from moving along the axial core direction of the position indicator 100C.

In the above-described configuration, when pressing force is applied to the pen tip side of the position indicator 100C along the axial core direction, i.e., when a writing pressure is applied, the ferrite core 104C presses the pressure detecting chip 300 via the elastic member 133 of the pressure sensing device 130 by the pressure depending on this writing pressure. As described above, the capacitance Cv of the pressure detecting chip 300 changes depending on the writing pressure transmitted to the pressure detecting chip 300.

In this case, as shown in FIG. 16A, the pressure is applied to the first electrode 301 via the elastic member 133 on the side of the surface 301a, which receives the pressure. This causes the pressure detecting chip 300 to show the capacitance Cv depending on the writing pressure applied by the small-diameter part 104Cb of the ferrite core 104C.

In this case, the side of the surface across which the pressure detecting chip 300 receives the pressure is not directly pressed by the small-diameter part 104Cb of the ferrite core 104C and the elastic member 133 exists between the small-diameter part 104Cb of the ferrite core 104C and the pressure detecting chip 300. This enhances the pressure resistance and shock resistance on the side of the surface across which the pressure detecting chip 300 receives the pressure and can prevent this surface side from being broken by excessive pressure, unexpected instantaneous pressure, etc. That is, in the pressure sensing device 130, the pressure detecting chip 300 receives the pressure by the writing pressure via the elastic member 133 as the pressure transmitting member having predetermined elasticity. Therefore, the pressure sensing device 130 has pressure resistance and shock resistance against the pressure applied to the pressure detecting chip 300, specifically the first electrode 301, which receives the pressure.

Furthermore, the small-diameter part 104Cb of the ferrite core 104C is inserted in and guided by the communication hole 134 made in the package 131 of the pressure sensing device 130 to thereby be positioned. Therefore, the applied writing pressure is surely transmitted to the pressure detecting chip 300 via the elastic member 133.

The applied writing pressure is transmitted as a pressure to the surface 301a of the first electrode 301 of the pressure detecting chip 300 by the elastic member 133. Therefore, the applied writing pressure is surely applied to the surface 301a, across which the pressure detecting chip 300 receives the pressure, and the pressure sensing device 130 shows capacitance change corresponding to the writing pressure P. This permits favorable detection of the writing pressure.

At the part of the package 131 on the side opposite to the side engaged with the ferrite core 104C, a recess 136 is formed, to which the capacitor 1 is fitted along the axial core direction. This recess 136 has an inner diameter almost equal to the outer diameter of the capacitor 1 and a ring-shaped concave trench 136a is formed in the sidewall thereof, to which the ring-shaped projection 66 of the capacitor 1 is fitted.

Similarly to the above-described coupling member 8B, terminal members 137 and 138 formed of an electrical conductor having elasticity are led out at the bottom of the recess 136 of the package 131 through insert molding. They are so configured that both ends of the coil 105C, the first and second electrodes 301 and 302 of the variable capacitor configuring the pressure detecting chip 300, and the electrode conductor 35 and the axial core conductor 7 of the capacitor 1 are connected to each other.

Specifically, an end part 137a of the terminal member 137 connected to the first electrode 301 of the pressure detecting chip 300 is so led out as to be exposed on the bottom surface of the recess 136. The electrical connection of this terminal member 137 to the first electrode 301 of the pressure detecting chip 300 is made by, for example, a gold wire.

A concave hole 136b is formed in the bottom surface of this recess 136. One end 138a of the terminal member 138 connected to the second electrode 302 of the pressure detecting chip 300 is located in this concave hole 136b. The terminal member 138 is attached in contact with the second electrode 302 of the pressure detecting chip 300 to thereby be electrically connected to the second electrode 302.

Around the end part 138a of the terminal member 138 located in the concave hole 136b, an insertion hole 138b with a bent part of an electrically-conductive metal having elasticity is formed, whereby the projecting part of the axial core conductor 7 of the capacitor 1 can be inserted therein.

Therefore, when the capacitor 1 is inserted in the recess 136 of the package 131 of the pressure sensing device 130, the axial core conductor 7 of the capacitor 1 is inserted in the insertion hole 138b so as to contact the bent part of an electrically-conductive metal having elasticity. This electrically connects the axial core conductor 7 to the terminal member 138. At this time, simultaneously the electrode conductor 35 of the capacitor 1 abuts against the end part 137a of the terminal member 137 and thereby they are electrically connected to each other. Furthermore, the ring-shaped projection 66 of the capacitor 1 is fitted to the ring-shaped concave trench 136a of this recess 136 and thereby the capacitor 1 is locked to the package 131.

In this example, as shown in FIGS. 16A and 16B, terminals 139a and 139b electrically connected to the terminal members 137 and 138, respectively, by, for example, a gold wire (shown by the thin solid line) are provided on the top surface 131a of the package 131. To these terminals 139a and 139b, one end 105Ca and the other end 105Cb, respectively, of the coil 105C wound around the ferrite core 104C are connected.

Based on the above-described configuration, the capacitor 1 is inserted and fitted into the recess 136 of the resonant circuit unit obtained by monolithically configuring the ferrite core 104C, on which the core body 101C is disposed and around which the coil 105C is wound, and the pressure sensing device 130. This connects the electrode conductor 35 and the axial core conductor 7 of the capacitor 1 to one end 105Ca and the other end 105Cb, respectively, of the coil 105C, and also to the first electrode 301 and the second electrode 302, respectively, of the pressure detecting chip 300.

Therefore, this position indicator 100C also has a circuit configuration similar to that of the equivalent circuit shown in FIG. 14.

Coupling of the capacitor 1 to the push switch 118A in this position indicator 100C is made by the coupling member 9A similarly to the position indicator 100B of the above-described embodiment. Therefore, description thereof is omitted here.

As described above, also in the position indicator 100C of this example, the resonant frequency of the resonant circuit can be set to the desired frequency by performing division treatment for the necessary patterns among the axially-disposed conductor patterns 34a to 34g configuring the area-changeable conductor patterns 33a to 33g of the capacitor 1.

Although the capacitor 1 of the first embodiment is employed as the capacitor configuring the resonant circuit with the coil 105C in the above-described example of FIG. 15, it is obvious that the capacitor 1B of the second embodiment can be similarly used.

Modification Examples of First Embodiment or Second Embodiment

Modification Examples of Capacitance-Forming Conductor Patterns

In the capacitor 1 of the first embodiment and the capacitor 1B of the second embodiment described above, the plural capacitance-forming conductor patterns 32a to 32g and 32Ba to 32Bg are made the same in the width W along the winding axial core direction of the dielectric film 2 (film capacitor 5) and are made different in the length along the winding direction. Thereby, their areas are made different and the values of the capacitance formed with the conductor layer 4 on the back surface side are made different from each other.

However, it is obvious that the plural capacitance-forming conductor patterns are not limited to those having such shape and size and various pattern shapes and sizes can be employed.

Figure 18A:
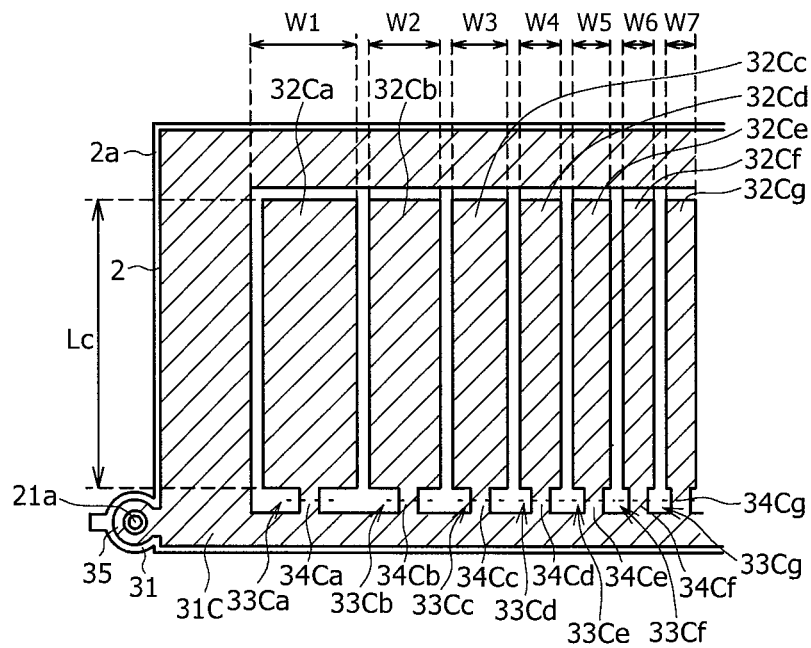
FIGS. 18A and 18B are diagrams showing a configuration example of another embodiment of the capacitor according to this invention.

FIG. 18A shows one example thereof. In this example, the widths, along the winding axial core direction, of plural capacitance-forming conductor patterns 32Ca to 32Cg formed on one surface 2a of the dielectric film 2 are set to different widths W1, W2, W3, W4, W5, W6, and W7 and the lengths thereof along the winding direction are set to the same length Lc. Thereby, their areas are made different.

In this example of FIG. 18A, area-changeable conductor patterns 33Ca to 33Cg including circumferentially-disposed conductor patterns 34Ca to 34Cg are provided between a common conductor pattern 31C and the plural capacitance-forming conductor patterns 32Ca to 32Cg. However, it is obvious that in this example of FIG. 18A also, patterns including axially-disposed conductor patterns, instead, may be employed as the area-changeable conductor patterns formed between the common conductor pattern 31C and the plural capacitance-forming conductor patterns 32Ca to 32Cg.

Figure 18B:
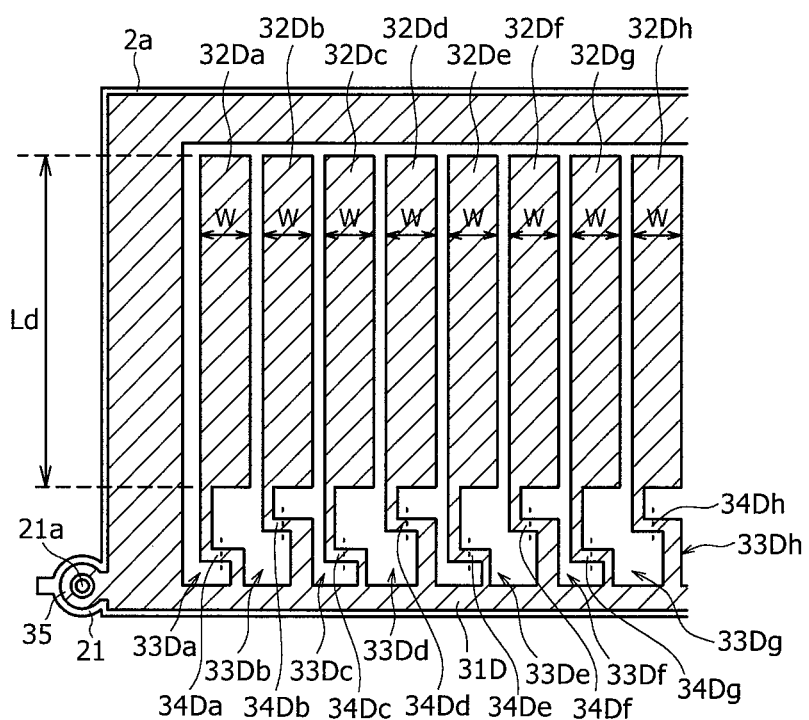

FIG. 18B shows another example of the plural capacitance-forming conductor patterns. In this example, plural capacitance-forming conductor patterns 32Da to 32Dh all having the same width W and the same length Ld are formed on one surface 2a of the dielectric film 2. In the case of this example, all of the values of the capacitance configured by the capacitance-forming conductor patterns 32Da to 32Dh are the same if the conductor layer 4 is uniformly formed on the back surface side of the dielectric film 2. Therefore, although adjustment of the capacitance is rough, the adjustment is enabled by only deciding the number of divided capacitance-forming conductor patterns. Therefore, there is an advantage that the setting of the capacitance becomes correspondingly easy.

In this example of FIG. 18B, area-changeable conductor patterns 33Da to 33Dh including axially-disposed conductor patterns 34Da to 34Dh are provided between a common conductor pattern 31D and the plural capacitance-forming conductor patterns 32Da to 32Dh. Furthermore, in consideration of the case in which the width W is comparatively small, the axially-disposed conductor patterns 34Da to 34Dh are not disposed at the same position in the circumferential direction and are alternately shifted (offset) from each other.

In the above-described example of FIG. 18A, the division (severance) direction is the axial core direction shown by the dotted line in FIG. 18A and the possible division positions are close to each other when the capacitance-forming conductor patterns having small widths are adjacent to each other. In the example of FIG. 18B, the division positions can be set more distant from each other in the area-changeable conductor patterns adjacent to each other by making the division positions different in the axial core direction and the circumferential direction.

It is obvious that, in this example of FIG. 18B, patterns including circumferentially-disposed conductor patterns may be employed as the area-changeable conductor patterns formed between the common conductor pattern 31D and the plural capacitance-forming conductor patterns 32Da to 32Dg.

Moreover, the plural capacitance-forming conductor patterns are not limited to those having rectangular shapes like in the above-described examples. For example, as shown in an example of FIG. 19, plural capacitance-forming conductor patterns 32Ea to 32Eg having pattern shapes different from each other may be formed on one surface 2a of the dielectric film 2.

Figure 19:
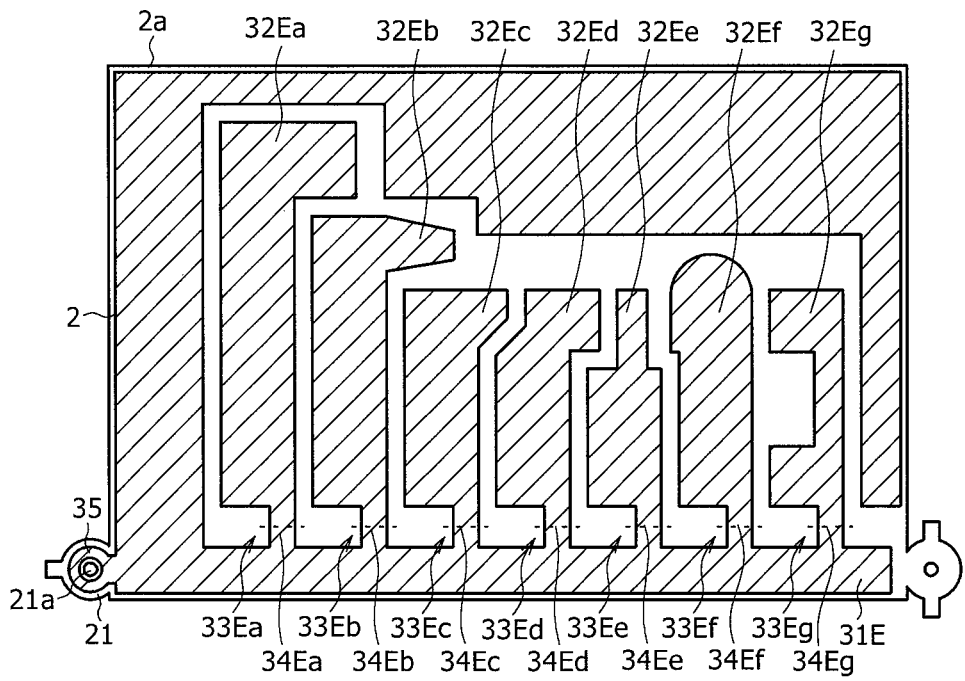
FIG. 19 is a diagram showing a configuration example of another embodiment of the capacitor according to this invention.

In this example of FIG. 19, area-changeable conductor patterns 33Ea to 33Eg including circumferentially-disposed conductor patterns 34Ea to 34Eg are provided between a common conductor pattern 31E and plural capacitance-forming conductor patterns 32Ea to 32Eg. However, it is obvious that patterns including axially-disposed conductor patterns may be employed as the area-changeable conductor patterns formed between the common conductor pattern 31E and the plural capacitance-forming conductor patterns 32Ea to 32Eg also in this example of FIG. 19.

Other Examples of Pattern of Conductor Electrodes Connected to Push Switch

In the capacitors 1 and 1B of the above-described first and second embodiments, electrodes having a half-ring shape with the same diameter are employed as the pattern of the conductor electrodes connected to the push switch 118A as a switch circuit. Therefore, the conductor electrodes may not be correctly electrically connected to one end and the other end of the push switch 118A unless they are properly positioned in the circumferential direction. That is why the above-described positioning by use of the projection along the axial core direction and the concave trench is carried out.

Figure 20A:
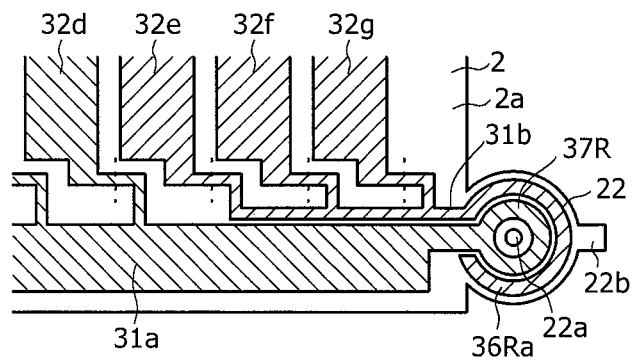
FIGS. 20A to 20C are diagrams showing a configuration example of another embodiment of the capacitor according to this invention.
Figure 20B:
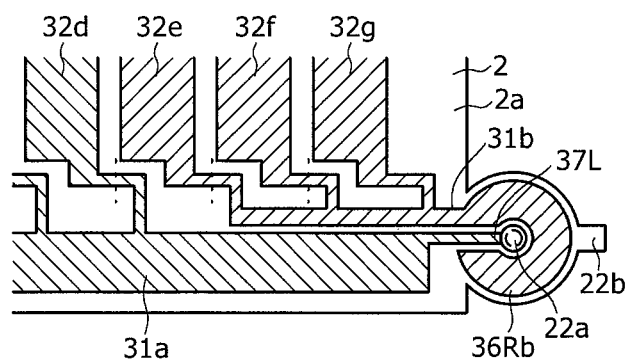
Figure 20C:
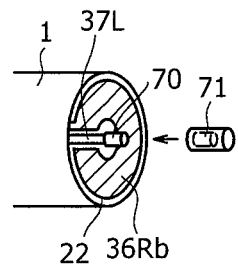

FIGS. 20A to 20C show examples in which the conductor electrode pattern is so configured that such positioning can be made easy or unnecessary. The examples of FIGS. 20A to 20C are the case of application to two conductor electrodes extended from the first common conductor pattern 31a and the second common conductor pattern 31b to the circular projection 22 in the capacitor 1 of the first embodiment.

FIG. 20A shows a first example thereof. In this first example, for the first common conductor pattern 31a, a ring-shaped conductor electrode 37R connected to this first common conductor pattern 31a is formed on the circular projection 22. This ring-shaped conductor electrode 37R has a small diameter and is separate from the center hole 22a.

For the second common conductor pattern 31b, a ring-shaped conductor electrode 36Ra having a large diameter is so formed as to be connected to this second common conductor pattern 31b and separate from the ring-shaped conductor electrode 37R.

According to this example of FIG. 20A, the conductor pattern of the ring-shaped conductor electrode 36Ra is partially divided (cut) by the first common conductor pattern 31a so that the ring-shaped conductor electrode 36Ra may be prevented from intersecting with the part of the thin conductor pattern extending from the first common conductor pattern 31a to be connected to the ring-shaped conductor electrode 37R. However, this divided (cut) part is small. Thus, the ring-shaped conductor electrode 37R can be separated from the ring-shaped conductor electrode 36Ra along almost the entire angular range, and the connection thereof to one end and the other end of the push switch 118A can be readily made. Therefore, there is an advantage that the accuracy of the positioning in the circumferential direction is not strictly needed as compared to the capacitor 1 of the first embodiment and the capacitor 1B of the second embodiment.

FIGS. 20B and 20C show a second example. In the above-described embodiment, a winding axis such as the axial core conductor 7 is not used as the electrode on the side of the circular projection 22. This second example is an example of the case in which the winding axis of the capacitor 1 is used as the electrode.

In this second example, as the winding axis, the first axial core conductor 7 having an end part projected to the side of the circular projection 21 and a second axial core conductor 70 as a different body electrically disconnected from this first axial core conductor 7 are used, although not shown in the diagram. An insulating coating is made or an insulating sheet is wound around the part of the second axial core conductor 70 other than the part projecting from the side of the circular protrusion 22 so that this part is electrically disconnected from the second conductor layer 4 formed on the back surface 2b of the dielectric film 2.

When the rod-shaped capacitor 1 is formed and the circular projection 22 is bent and fixed to its end surface, the metal conductor part of the second axial core conductor 70 is projected to the external through the penetration hole 22a of the circular projection 22 as shown in FIG. 20C.

In this second example, for the second common conductor pattern 31b, a ring-shaped conductor electrode 36Rb partially notched is formed on the circular projection 22 by extending the conductor pattern from the second common conductor pattern 31b similarly to the first example.

For the first common conductor pattern 31a, a conductor pattern 37L connected to the first common conductor pattern 31a is so formed as to be extended to the penetration hole 22a of the circular projection 22 so as to be electrically connected to the second axial core conductor 70 projecting from the penetration hole 22a of the circular projection 22 by soldering or the like.

Therefore, the part of the axial core conductor 70 projecting from the circular projection 22 can be used as the electrode in the case of this example. Furthermore, when this axial core conductor 70 is formed by an insulator such as a resin material or when the diameter of this axial core conductor 70 is small, a tubular conductor adapter 71 shown in FIG. 20C can be used as the electrode by covering the second axial core conductor 70 with it and then electrically connecting them by soldering or the like.

This second example of FIGS. 20B and 20C also achieves the same operation and effects as those of the first example of FIG. 20A. In addition, it also provides an effect that the same configuration, which is based on an axial core conductor and a conductor pattern electrode around it, can be employed as the electrode structure for both ends of the capacitor 1.

Third Embodiment

In both of the above-described embodiments, the area-changeable conductor pattern is so configured that the capacitance-forming conductor pattern is isolated from the common conductor pattern by dividing (cutting) the conductor pattern and thereby the capacitance value of the capacitor is changed.

In contrast, the following configuration can be employed. Specifically, capacitance-forming conductor patterns are so formed as to be divided from a common conductor pattern in advance. In addition, treatment of soldering, connecting by a conductor, etc. is performed as physical treatment for changing the capacitance value. Thereby, the capacitance-forming conductor pattern is connected to the common conductor pattern to adjust the capacitance value.

A third embodiment is an example of this case. FIGS. 21A to 22C show a configuration example of a capacitor 1F of this third embodiment. In this third embodiment, the same part as that in the above-described first embodiment is given the same reference numeral.

Figure 21A:
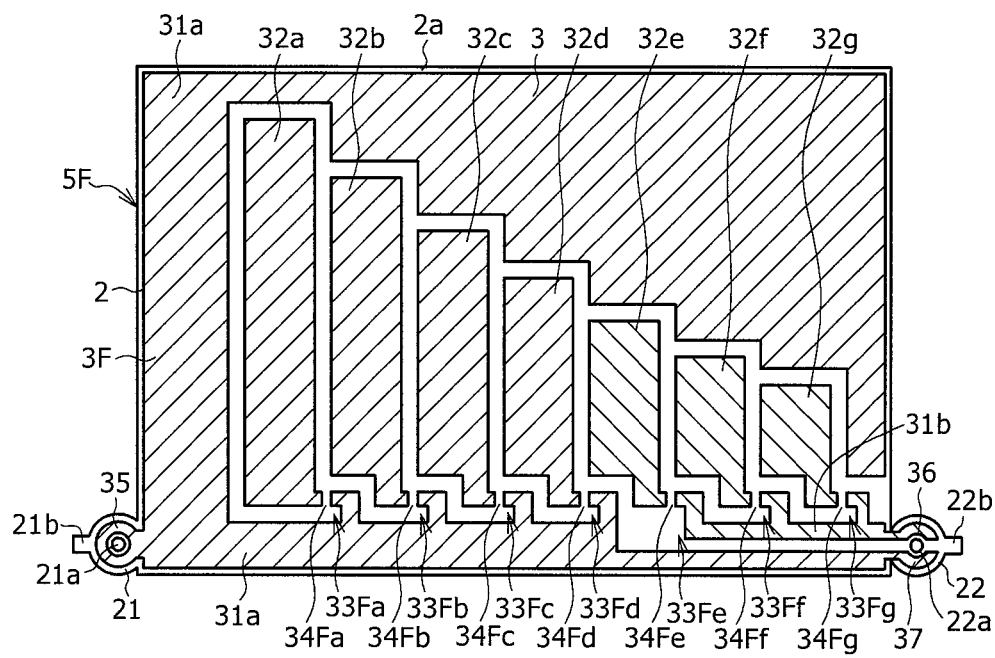
FIGS. 21A and 21B are diagrams showing a configuration example of another embodiment of the capacitor according to this invention.

In this third embodiment, as shown in FIG. 21A, a first conductor layer 3F is formed on the front surface 2a of the dielectric film 2 similarly to the capacitor 1 shown in FIGS. 1A to 1C. The first conductor layer 3F is composed of the first common conductor pattern 31a, the second common conductor pattern 31b, seven capacitance-forming conductor patterns 32a to 32g, and area-changeable conductor patterns 33Fa to 33Fg formed between the first and second common conductor patterns 31a and 31b and the capacitance-forming conductor patterns 32a to 32g, respectively.

In this third embodiment, as shown in FIG. 21A, the area-changeable conductor patterns 33Fa to 33Fg formed between the first and second common conductor patterns 31a and 31b and the capacitance-forming conductor patterns 32a to 32g, respectively, include axially-divided conductor patterns 34Fa to 34Fg in each of which a conductor pattern is divided in the axial core direction.

Figure 21B:
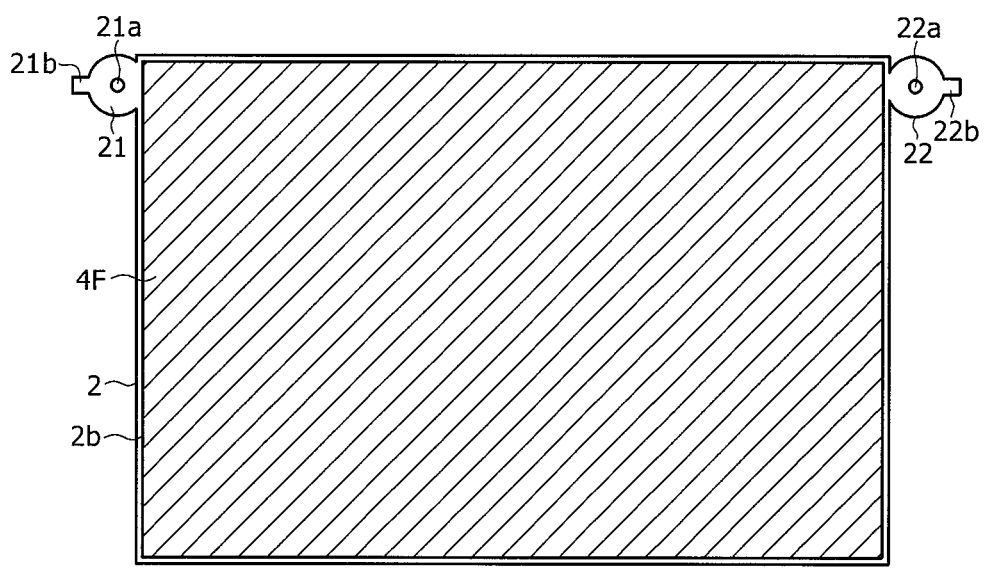

As shown in FIG. 21B, a second conductor layer 4F is uniformly formed on the side of the back surface 2b of the dielectric film 2, including the regions opposed to the area-changeable conductor patterns 33Fa to 33Fg.

Figure 22A:
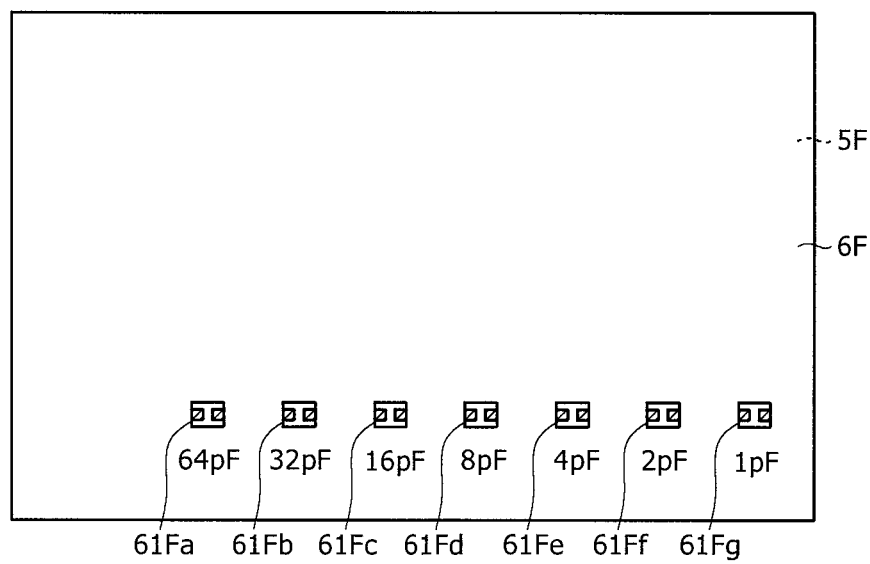
FIGS. 22A to 22C are diagrams showing a configuration example of another embodiment of the capacitor according to this invention.
Figure 22B:
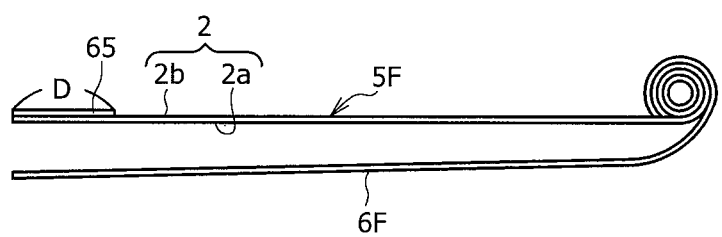

As shown in FIGS. 22A and 22B, an insulating film 6F is overlapped on the back surface 2b of the dielectric film 2 of the film capacitor 5F formed of the dielectric film 2, on which the first conductor layer 3F and the second conductor layer 4F are formed on the front and back surfaces as described above, and they are wound into a rod shape. Thereby, the capacitor 1F shown in FIG. 22C is formed.

In this case, in the insulating film 6F, apertures 61Fa to 61Fg are made at the positions corresponding to the axially-divided conductor patterns 34Fa to 34Fg, which are the area-changeable conductor patterns 33Fa to 33Fg of the conductor layer 3F on the front surface 2a of the dielectric film 2 configuring the film capacitor 5F. Therefore, the axially-divided conductor patterns 34Fa to 34Fg on the front surface 2a of the dielectric film are exposed to the external through the apertures 61Fa to 61Fg as shown in FIG. 22A.

Figure 22C:
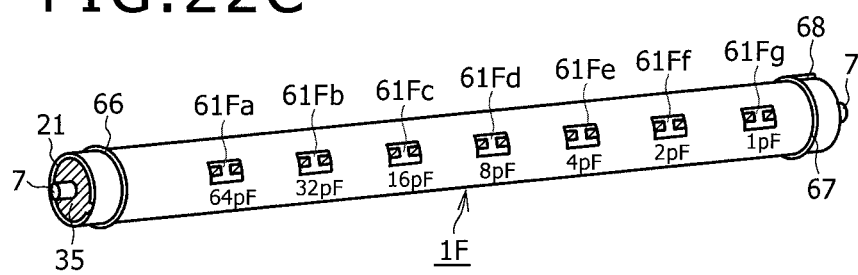

As shown in FIGS. 22A and 22C, near the respective apertures 61Fa to 61Fg, the capacitance values according to the respective areas of the capacitance-forming conductor patterns 32a to 32g, which are electrically disconnected due to division at the axially-divided conductor patterns 34Fa to 34Fg as the area-changeable conductor patterns 33Fa to 33Fg, are marked by printing, for example.

As shown in FIGS. 22A and 22C, the axially-divided conductor patterns 34Fa to 34Fg as the area-changeable conductor patterns 33Fa to 33Fg are formed at the same position in the circumferential direction of the rod-shaped capacitor 1F in such a manner as to be arranged in one row at equal intervals along the axial core direction of the rod-shaped capacitor 1F. Thus, the apertures 61Fa to 61Fg are arranged in one row at equal intervals along the axial core direction of the rod-shaped capacitor 1F as shown in FIGS. 22A and 22C.

Although diagrammatic representation is omitted in FIGS. 22A and 22C, circumferential position marks, segment mark, axial core direction marks, and so forth may be printed for example to be further additionally displayed in relation to the apertures 61Fa to 61Fg similarly to the first embodiment.

In the case of the capacitor 1F of this third embodiment, adjustment in such a direction as to increase the capacitance can be performed by connection treatment for the axially-divided conductor patterns 34Fa to 34Fg in the apertures 61Fa to 61Fg, respectively. This connection treatment can be performed not only manually but also as automatic treatment similarly to the above-described division treatment. The apertures 61Fa to 61Fg, including the connected part, are sealed by a resin material or the like to maintain the quality of the moisture resistance and so forth.

In the above-described example of the third embodiment, the area-changeable conductor patterns 33Fa to 33Fg include the axially-divided conductor patterns 34Fa to 34Fg, in each of which a pattern along the axial core direction is divided. However, they may include circumferentially-divided conductor patterns, in each of which a pattern along the circumferential direction is divided as described above.

Other Embodiments or Modification Examples

In the above-described embodiments, the axially-disposed conductor patterns, the circumferentially-disposed conductor patterns, the axially-divided conductor patterns, and the circumferentially-divided conductor patterns are configured at the same position in the circumferential direction of the rod-shaped capacitor in such a manner as to be arranged in one row along the axial core direction. However, it is also possible to dispose these patterns at different positions in the circumferential direction.

Figure 23A:
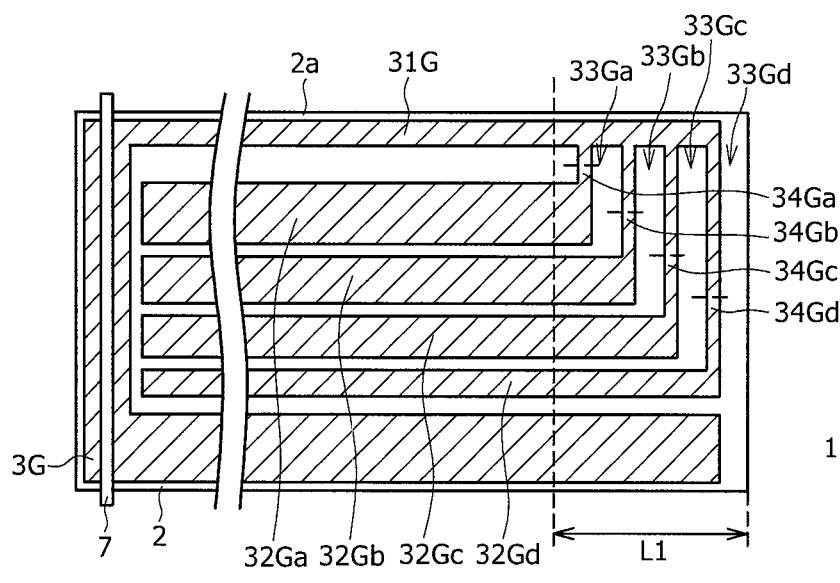
FIGS. 23A to 23D are diagrams showing a configuration example of another embodiment of the capacitor according to this invention.
Figure 23B:
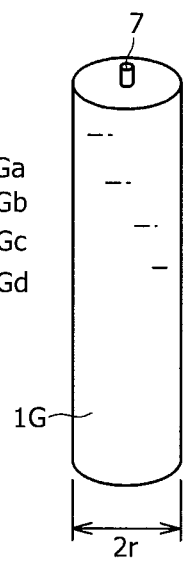

FIGS. 23A and 23B are diagrams showing a configuration example of a capacitor 1G as one example configured in this manner. In this example, the following conductor pattern is formed as a first conductor layer 3G on the front surface 2a of the dielectric film 2 similarly to the above-described embodiments. Suppose that the second conductor layer 4 is almost uniformly formed on the back surface 2b of the dielectric film 2.

Specifically, as shown in FIG. 23A, on the front surface 2a of the dielectric film 2, plural capacitance-forming conductor patterns 32Ga to 32Gd are formed in the winding axial core direction and a common conductor pattern 31G is formed in common to these capacitance-forming conductor patterns 32Ga to 32Gd. Furthermore, area-changeable conductor patterns 33Ga to 33Gd including axially-disposed conductor patterns 34Ga to 34Gd, respectively, are formed between the common conductor pattern 31G and the capacitance-forming conductor patterns 32Ga to 32Gd.

In the case of this example, the axially-disposed conductor patterns 34Ga to 34Gd are formed at positions shifted in not only the axial core direction but also in the circumferential direction as shown in FIG. 23A. In this case, all of the axially-disposed conductor patterns 34Ga to 34Gd are so formed as to exist in a region range within a distance L1 from the winding-finish end of the dielectric film 2, with a relationship of $L1 < 2\pi r$ satisfied when the radius of the rod-shaped capacitor 1G shown in FIG. 23B is defined as r. This causes all of the axially-disposed conductor patterns 34Ga to 34Gd to exist on the outermost circumferential surface of the capacitor 1G as shown by the dotted lines in FIG. 23B, and enables division treatment as physical treatment after the completed component is formed.

Figure 23C:
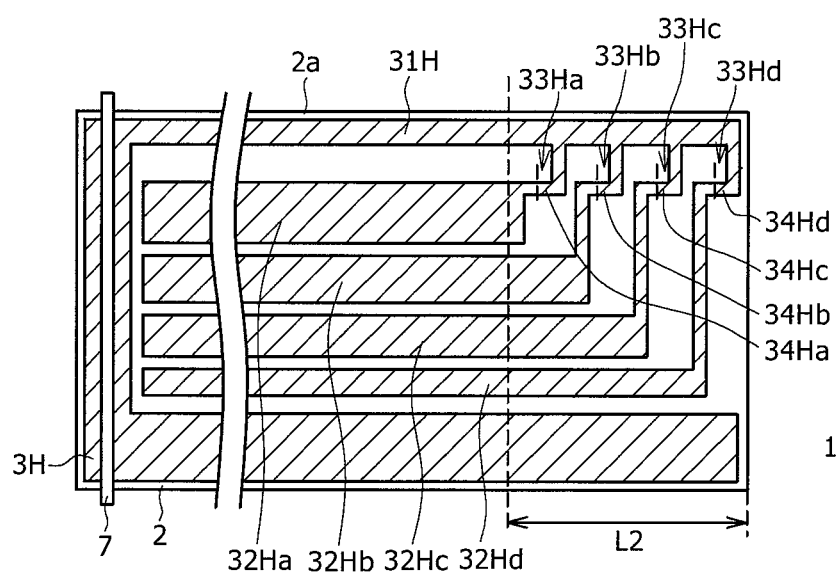
Figure 23D:
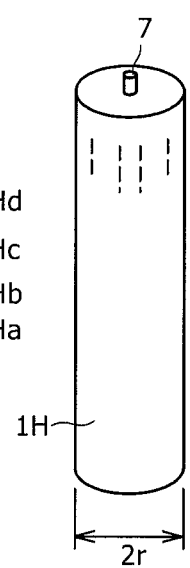

FIGS. 23C and 23D are diagrams showing a configuration example of a capacitor 1H as another example. In the capacitor 1H of this example, as a first conductor layer 3H formed on the front surface 2a of the dielectric film 2, a common conductor pattern 31H, capacitance-forming conductor patterns 32Ha to 32Hd, and area-changeable conductor patterns 33Ha to 33Hd are formed, similarly to the conductor layer 3G. However, in the case of this example, the area-changeable conductor patterns 33Ha to 33Hd include not axially-disposed conductor patterns but circumferentially-disposed conductor patterns 34Ha to 34Hd, respectively.

As shown in FIG. 23C, the circumferentially-disposed conductor patterns 34Ha to 34Hd are formed at the same position in the axial core direction and at different positions in the circumferential direction. Also in the case of this example, all of the circumferentially-disposed conductor patterns 34Ha to 34Hd are so formed as to exist in a region range within a distance L2 from the winding-finish end of the dielectric film 2, with a relationship of $L2 < 2\pi r$ satisfied. This causes all of the circumferentially-disposed conductor patterns 34Ha to 34Hd to exist on the outermost circumferential surface of the capacitor 1H as shown by the dotted lines in FIG. 23D, and enables division treatment as physical treatment for setting the capacitance value after the completed component is formed.

Although the case of axially-disposed conductor patterns and circumferentially-disposed conductor patterns, for which division treatment is performed after the completed component is formed, is described with FIGS. 23A to 23D, axially-divided conductor patterns and circumferentially-divided conductor patterns may also be so formed as to be disposed at different positions in the circumferential direction as described above.

In the above-described embodiments, the insulating film 6 is wound together with the film capacitor 5 in order to avoid an electrical connection between the first conductor layer 3 and the second conductor layer 4 on the front and back surfaces of the dielectric film 2. However, instead of using the insulating film 6, an insulating coating may be provided on one or both of the first conductor layer 3 and the second conductor layer 4 on the front and back surfaces of the film capacitor 5.

Alternatively, a rod-shaped capacitor may be formed in the following manner. Specifically, the first conductor layer 3 and the second conductor layer 4 are formed by deposition on one surface of a respective one of two dielectric films. Then, two dielectric films are wound into the rod shape in the state in which the surface of the dielectric film including the first conductor layer 3, on which the first conductor layer 3 is not formed, is bonded to the surface of the dielectric film including the second conductor layer 4, on which the second conductor layer 4 is formed. Furthermore, the outer shape of the capacitor wound into the rod shape may be a circular column shape, a polygonal column shape, or another shape.

In the above description, the case in which the capacitor of this invention is used as a capacitor of a resonant circuit in a position indicator for adjustment of the resonant frequency of the resonant circuit is taken as one example. However, the capacitor of this invention can be used for frequency adjustment or frequency tuning in various pieces of electronic apparatus, not only in the position indicator. For example, it can be used for various use purposes such as adjustment of the wireless transmission frequency in short-range wireless communication apparatus, adjustment of the tuning frequency in a radio receiver, and adjustment of the tuning frequency in a contactless IC card.

DESCRIPTION OF REFERENCE SYMBOLS

104 . . . Ferrite core, 105 . . . Coil, 118, 118A . . . Push switch, 1, 1B to 1H . . . Capacitor, 2 . . . Dielectric film, 3 . . . First conductor layer, 4 . . . Second conductor layer, 5 . . . Film capacitor, 6 . . . Insulating film, 7 . . . Axial core conductor, 31a . . . First common conductor pattern, 31b . . . Second common conductor pattern, 32a to 32g . . . Capacitance-forming conductor pattern, 33a to 33g . . . Area-changeable conductor pattern, 34a to 34g . . . Axially-disposed conductor pattern, 34Ba to 34Bg . . . Circumferentially-disposed conductor pattern, 34Fa to 34Fg . . . Axially-divided conductor pattern.

The invention claimed is:

1. A pen-shaped position pointer, comprising:
a housing having an elongated shape along an axis of the pen-shaped position pointer;
a core body having a distal end, which serves as a pointer tip, wherein the core body is received in the housing such that the pointer tip extends from a distal end of the housing;
a core disposed proximate to the pointer tip of the core body along the axis of the pen-shaped position pointer, wherein a coil is wound around the core;
a pressure sensing device disposed in the housing along the axis of the pen-shaped position pointer;
a capacitor disposed in the housing along the axis of the pen-shaped position pointer, wherein the capacitor, the pressure sensing device, and the coil wound around the core form a resonant circuit, and a resonant characteristic of the resonant circuit changes in response to a pressure applied to the pointer tip of the core body; and
a coupling member including at least one terminal member having a distal end and a proximal end, wherein the coupling member includes a first recess in which the distal end of the at least one terminal member is exposed to be connected to the capacitor forming the resonant circuit, and the coupling member includes a second recess in which the proximal end of the at least one terminal member is exposed to be connectable to an operation switch that is configured to control the resonant characteristic of the resonant circuit and disposed proximate to the coupling member; wherein the operation switch includes a columnar chassis and a pressing part exposed at a circumferential side surface of the columnar chassis, wherein the pressing part is configured to be pressed to turn on/off the operation switch; and the first recess of the coupling member includes a first ring-shaped groove configured to receive a first ring-shaped projection provided at a circumferential side surface of the capacitor, and the second recess of the coupling member includes a second ring-shaped groove configured to receive a second ring-shaped projection provided at the circumferential side surface of the columnar chassis of the operation switch.

2. The pen-shaped position pointer of claim 1, further comprising a position limiter that defines relative circumferential positions between the coupling member and the capacitor.

3. The pen-shaped position pointer of claim 1, further comprising a position limiter that defines relative circumferential position between the coupling member and the operation switch.

4. The pen-shaped position pointer of claim 1, wherein the core is a first ferrite core.

5. The pen-shaped position pointer of claim 4, wherein
a second ferrite core is disposed between the core body and the first ferrite core, along the axis of the pen-shaped position pointer; and
the inductance of the coil changes according to a changing distance between the first ferrite core, around which the coil is wound, and the second ferrite core in response to a pressure applied to the pointer tip of the core body.

6. The pen-shaped position pointer of claim 1, wherein the core body has a rod shape, and is replaceable via the distal end of the housing from which the pointer tip extends.

7. The pen-shaped position pointer of claim 1, wherein the core body integrally extends from the core toward and beyond the distal end of the housing.

8. The pen-shaped position pointer of claim 1, wherein a pressure contact is rendered between the capacitor and the coupling member.

9. The pen-shaped position pointer of claim 1, wherein a pressure contact is rendered between the coupling member and the operation switch.

10. The pen-shaped position pointer of claim 1, comprising:
a spring disposed proximate to the operation switch to bias the operation switch, the coupling member, and the resonant circuit toward the core body.

11. The pen-shaped position pointer of claim 10, wherein the spring is a coil spring.

* * * * *